US009660118B2

(12) United States Patent
Taniguchi et al.

(10) Patent No.: US 9,660,118 B2
(45) Date of Patent: May 23, 2017

(54) LAMINATE FOR SOLAR CELL AND SOLAR CELL MODULE PRODUCED USING SAME

(75) Inventors: Kouichirou Taniguchi, Shiga (JP); Kazuya Tanaka, Shiga (JP)

(73) Assignee: DAI NIPPON PRINTING CO., LTD., Tokyo (JP)

(*) Notice: Subject to any disclaimer, the term of this patent is extended or adjusted under 35 U.S.C. 154(b) by 1016 days.

(21) Appl. No.: 13/989,957

(22) PCT Filed: Nov. 29, 2011

(86) PCT No.: PCT/JP2011/077565
§ 371 (c)(1),
(2), (4) Date: Jun. 11, 2013

(87) PCT Pub. No.: WO2012/073971
PCT Pub. Date: Jun. 7, 2012

(65) Prior Publication Data
US 2013/0247987 A1  Sep. 26, 2013

(30) Foreign Application Priority Data

Nov. 30, 2010  (JP) .................................. 2010-267013
Dec. 24, 2010  (JP) .................................. 2010-288460

(51) Int. Cl.
*H01L 31/048*  (2014.01)
*C08L 53/00*  (2006.01)
(Continued)

(52) U.S. Cl.
CPC .......... *H01L 31/0481* (2013.01); *B32B 27/08* (2013.01); *B32B 27/18* (2013.01);
(Continued)

(58) Field of Classification Search
CPC ................................................ H01L 31/0481
See application file for complete search history.

(56) References Cited

U.S. PATENT DOCUMENTS 5,698,317 A * 12/1997 Kurokawa .............. B32B 27/32
428/349
8,865,835 B2 * 10/2014 Taniguchi ........... C08L 23/0815
525/88
(Continued)

FOREIGN PATENT DOCUMENTS

JP          58 60579          4/1983
JP          60 168708         9/1985
(Continued)

OTHER PUBLICATIONS

Machine translation of KR2010138559 A, retrieved Apr. 2016.*
(Continued)

*Primary Examiner* — Nicole M Buie-Hatcher
(74) *Attorney, Agent, or Firm* — Oblon, McClelland, Maier & Neustadt, L.L.P.

(57) ABSTRACT

Provided are a laminate for solar cells, which facilitates production of solar cell modules, which does not require a crosslinking step and which is excellent in transparency, moisture-proofness, sealability and handleability (rigidity), and a solar cell module produced by the use of the laminate. The laminate for solar cells has a resin layer (I)-1 or a resin layer (I)-2 as at least one outermost layer thereof, and has a resin layer (II) that contains an etylene-based polymer (C) satisfying a specific requirement and a nucleating agent (D). The resin layer (I)-1 is a resin layer containing an ethylene/α-olefin random copolymer (A) satisfying a specific requirement, and an ethylene/α-olefin block copolymer (B) satisfying a specific requirement. The resin layer (I)-2 is a resin layer containing a silane-modified etylene-based resin (X).

20 Claims, 1 Drawing Sheet

(51) Int. Cl.
*C08L 23/08* (2006.01)
*B32B 27/32* (2006.01)
*B32B 27/18* (2006.01)
*B32B 27/08* (2006.01)

(52) U.S. Cl.
CPC .......... *B32B 27/32* (2013.01); *C08L 23/0815* (2013.01); *C08L 53/00* (2013.01); *B32B 2307/412* (2013.01); *B32B 2307/544* (2013.01); *B32B 2307/704* (2013.01); *B32B 2307/7246* (2013.01); *B32B 2307/7265* (2013.01); *B32B 2457/12* (2013.01); *C08L 2314/06* (2013.01); *Y02B 10/12* (2013.01); *Y02E 10/50* (2013.01)

(56) References Cited

U.S. PATENT DOCUMENTS

| | | | |
|---|---|---|---|
| 2006/0173123 A1* | 8/2006 | Yang | C08K 5/01 524/543 |
| 2008/0115825 A1 | 5/2008 | Patel et al. | |
| 2009/0120489 A1 | 5/2009 | Nishijima et al. | |
| 2009/0173384 A1* | 7/2009 | Ooi | C08F 255/02 136/259 |
| 2010/0206378 A1* | 8/2010 | Erickson, Jr. | H01L 31/02021 136/259 |

FOREIGN PATENT DOCUMENTS

| | | | | |
|---|---|---|---|---|
| JP | 61 115916 | | 6/1986 | |
| JP | 61 252407 | | 11/1986 | |
| JP | 61 271308 | | 12/1986 | |
| JP | 2000 91611 | | 3/2000 | |
| JP | 2005 19975 | | 1/2005 | |
| JP | 2009 79101 | | 4/2009 | |
| JP | 2009-274349 A | | 11/2009 | |
| JP | 2010 504646 | | 2/2010 | |
| JP | 2010 171419 | | 8/2010 | |
| JP | 2011 18889 | | 1/2011 | |
| KR | 2010138559 A | * | 12/2010 | |
| TW | 200830568 A | | 7/2008 | |
| WO | 2006 095762 | | 9/2006 | |
| WO | WO 2008036707 A2 | * | 3/2008 | ....... B32B 17/10018 |
| WO | 2010 042335 | | 4/2010 | |
| WO | 2011 007871 | | 1/2011 | |
| WO | 2011 108600 | | 9/2011 | |

OTHER PUBLICATIONS

International Search Report Issued Jan. 17, 2012 in PCT/JP11/77565 Filed Nov. 29, 2011.
Combined Office Action and Search Report issued Aug. 21, 2015 in Taiwanese Patent Application No. 100143882 (with English translation of Category of Cited Documents).

* cited by examiner

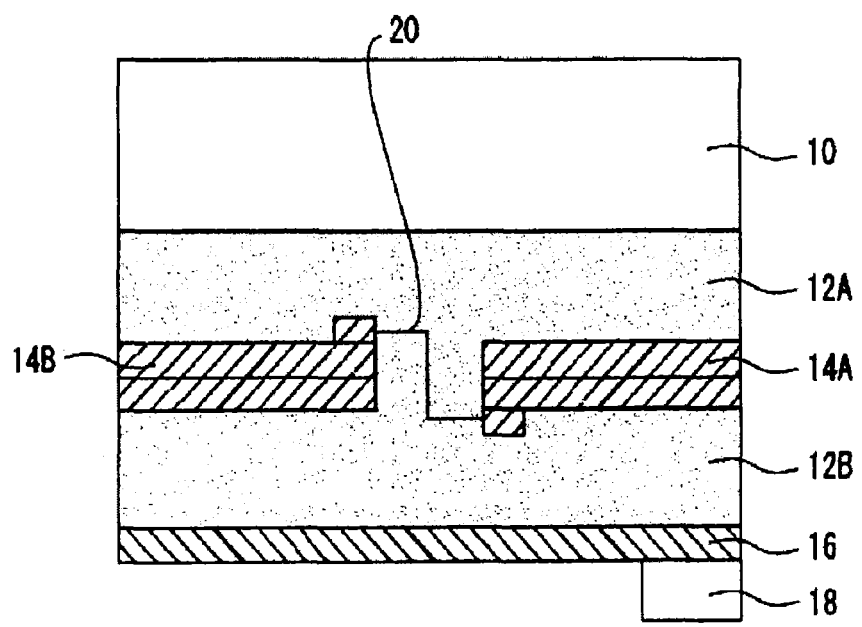

LAMINATE FOR SOLAR CELL AND SOLAR CELL MODULE PRODUCED USING SAME

TECHNICAL FIELD

The present invention relates to a laminate for solar cells, having excellent moisture-proofness, transparency and heat resistance, and capable of imparting excellent sealability and handleability in producing solar cell modules.

BACKGROUND ART

Recently, with the increase in public awareness of environmental issues such as global warming and others, expectations for solar power generation have been much raised in view of the cleanness thereof and freeness from environmental pollution. A solar cell constitutes the main part of a solar power generation system which directly converts the energy of sunlight into electricity. Regarding the configuration of the solar cell, multiple solar cell elements (simply referred to as cells) are connected in series or in parallel and are packaged for protecting the cells to give individual units. The unit installed in the package is referred to as a solar cell module, and, in general, this is so designed that the face thereof to be exposed to sunlight is covered with a transparent substrate (front sheet) of glass or the like as a top protective material and sealed up with a resin layer (encapsulant material) of a thermoplastic plastic (for example, ethylene/vinyl acetate copolymer), and the back thereof is protected with a back sealing sheet (back sheet) as a back protective material.

Those solar cell modules are mainly used outdoors, and are therefore required to satisfy various properties in point of the configuration, the material constitution and others thereof. Mainly the above-mentioned encapsulant material is required to have flexibility and impact resistance for protecting solar cell elements, heat resistance for protecting solar cell modules in heat generation, transparency (total light transmission, etc.) for efficient arrival of sunlight to solar cell elements, durability, dimensional stability, flame retardation, moisture-proofness, etc.

At present, as a encapsulant material for solar cell elements in solar cell modules, an ethylene/vinyl acetate copolymer (hereinafter this may be abbreviated as EVA) is widely used as the constituent material thereof, from the viewpoint of flexibility, transparency and the like (for example, see Patent Reference 1). Mainly for imparting heat resistance to EVA, crosslinking is attained with an organic peroxide serving as a crosslinking agent. For this, there is employed a method of previously preparing an EVA sheet mixed with a crosslinking agent (organic peroxide) and a crosslinking promoter and sealing up solar cell elements by the use of the resulting sheet.

However, in case where solar cell modules are produced by the use of the EVA sheet, EVA may thermally decompose to generate acetic acid gas thereby having some negative influences on the working environment and the production apparatus and bringing about some problems of circuit corrosion in solar cells, interlayer delamination of various parts such as solar cell elements, front sheet, back sheet and others, depending on various conditions in their production such as thermal bonding under pressure, etc.

Further, EVA is insufficient in moisture-proofness, concretely in water vapor barrier performance (for example, the water vapor permeability of EVA having a thickness of 0.3 mm at a temperature of 40° C. and a relative humidity of 90% is from 25 to 35 g/(m$^2$·24 hours) or so), and therefore, in case of use in environments at high humidity or the like, moisture may reach the solar cell elements to be a cause of deteriorating the solar cells and lowering the power generation efficiency.

For solving the problems, for example, Patent Reference 2 discloses a solar cell encapsulant material using an ethylene/α-olefin copolymer. Patent Reference 3 discloses a solar cell encapsulant material using a silane-modified ethylene-based resin. As examples of resins more excellent in moisture-proofness than EVA, there are known high-density polyethylene and cyclic olefin-based resins with a cyclic olefin introduced into the molecular chain; and for example, Patent Reference 4 discloses a solar cell encapsulant material using a hydrogenated product of a norbornene-based ring-opened polymer as a cyclic olefin-based resin. Further, Patent Reference 5 discloses a solar cell encapsulant material of a laminate of an adhesive/heat-resistant layer and a buffer layer. Patent Reference 6 discloses a solar cell encapsulant material sheet produced by adding a C9-based aromatic hydrocarbon resin to EVA, though not intended to enhance moisture-proofness.

CITATION LIST

Patent References

Patent Reference 1: JP-A-58-60579
Patent Reference 2: JP-A-2000-91611
Patent Reference 3: JP-A-2005-19975
Patent Reference 4: JP-A-2009-79101
Patent Reference 5: WO2006/095762
Patent Reference 6: JP-A-2010-171419

SUMMARY OF THE INVENTION

Problems that the Invention is to Solve

However, the encapsulant material with EVA, typically as in Patent Reference 1, has a low elastic modulus at room temperature, and is often poor in rigidity as a solar cell module support and problematic in handleability in solar cell module production.

The solar cell encapsulant material with an ethylene/α-olefin copolymer disclosed in Patent Reference 2 can evade the influence of acetic acid gas from thermal decomposition of EVA; however, nothing is concretely disclosed relating to embodiments of use of ethylene/α-olefin copolymer favorable for solar cell encapsulant materials. This is considered because the technique disclosed in Patent Reference 2 may be for enhancing various properties such as heat resistance, transparency and others, as premised on crosslinking treatment like that for conventional EVA.

Next, the solar cell encapsulant material with a silane-modified ethylene-based resin disclosed in Patent Reference 3 is excellent in adhesiveness to various substrates in solar cell modules; however, it is difficult to obtain a single-layer encapsulant material excellent in all of sealability, moisture-proofness and transparency. In other words, when the crystallinity of the encapsulant material is lowered to soften the material, then the sealability and the transparency of the material could be bettered; but on the other hand, the moisture-proofness of the material lowers with increase in the reduction in the crystallinity thereof.

High-density polyethylene has relatively high moisture-proofness and is inexpensive, and enjoys wide industrial use; however, the rigidity thereof is too high and the flexibility thereof is insufficient, and therefore, for solar cell members, high-density polyethylene is poor in sealability and protect performance (cushionability) for solar cell elements, and in addition, the transparency thereof is insufficient and the power generation efficiency therewith is low.

The solar cell encapsulant material using a hydrogenated product of a norbornene-based ring-opened polymer as a cyclic olefin-based resin, as disclosed in Patent Reference 4, is excellent in moisture-proofness and transparency, but is economically inefficient since the raw material thereof is relatively expensive. In addition, the cyclic olefin-based resin generally has a high melt viscosity and is considered to be poor in sealability in sealing up solar cell elements; however, nothing is described or suggested in Patent Reference 4 relating to the sealability of the resin in sealing up solar cell elements. For example, in case where the sealing step is carried out at high temperature and under high pressure for increasing the flowability (fillability) of the resin used, there may occur some problems of degradation of wiring in solar cell elements at high temperature, or breakage of solar cell elements under high pressure. In addition, the vacuum laminator generally used in the sealing step, for example, in a batch-type solar cell module production apparatus, utilizes the difference in the vacuum degree using a vacuum pump, and in this, therefore, the pressure to be applied to the solar cell module is nearly atmospheric pressure (about 101.3 MPa). As opposed to this, for more increasing the pressure in sealing up a solar cell element by the use of the encapsulant material described in Patent Reference 4, the pressurization system must be modified to a hydraulic system or the like, therefore increasing the production cost.

Next, the solar cell encapsulant material of a laminate of an adhesive/heat-resistant layer and a buffer layer, as disclosed in Patent Reference 5, may readily give a solar cell encapsulant material excellent in transparency, flexibility, heat resistance and adhesiveness as employing a laminate configuration; however, the laminate configuration is (solar cell element)/hard layer/soft layer, or that is, the layer that adheres to and protects the solar cell element in the configuration is the hard layer, and therefore the laminate configuration is poor in sealability and protect performance (cushionability). In other words, it is difficult to obtain a solar cell sealing laminate or a solar cell encapsulant material excellent in all the properties of transparency, moisture-proofness, sealability and handleability, which the present invention is intended to satisfy. Further, in the technique described in Patent Reference 6, a C9-based aromatic hydrocarbon resin is added to EVA by which the moisture-proofness could be bettered in some degree as compared with the case to which the C9-based aromatic hydrocarbon resin is not added; however, it is still difficult to obtain sufficient moisture-proofness capable of preventing solar cell elements from being degraded by moisture.

In consideration of the prior-art problems as above, an object of the present invention is to provide a laminate for solar cells, which facilitates production of solar cell modules, which does not require a crosslinking step, which secures sufficient moisture-proofness for protection of solar cell elements and which has excellent transparency and heat resistance and has rigidity enough to provide excellent sealability and room-temperature handleability in solar cell module production, and to provide a solar cell module produced by the use of the laminate.

Means for Solving the Problems

The present invention relates to a laminate for solar cells, having a resin layer (I)-1 or a resin layer (I)-2 (hereinafter these are referred to as resin layer (I)) as at least one outermost layer thereof, and having a resin layer (II) that contains an etylene-based polymer (C) satisfying the following requirement (c) and a nucleating agent (D):

Resin layer (I)-1: a resin layer containing an ethylene/α-olefin random copolymer (A) satisfying the following requirement (a), and an ethylene/α-olefin block copolymer (B) satisfying the following requirement (b), Resin layer (I)-2: a resin layer containing a silane-modified etylene-based resin (X);

(a): The heat of crystal fusion of the copolymer, as measured at a heating rate of 10° C./min in differential scanning calorimetry, is from 0 to 70 J/g, (b) The crystal melting peak temperature of the copolymer, as measured at a heating rate of 10° C./min in differential scanning calorimetry, is from 100 to 145° C., and the heat of crystal fusion thereof is from 5 to 70 J/g, (c) The crystal melting peak temperature of the polymer, as measured at a heating rate of 10° C./min in differential scanning calorimetry, is from 100 to 145° C., and the heat of crystal fusion thereof is from 120 to 190 J/g.

The present invention also relates to a solar cell module produced by the use of the above-mentioned laminate for solar cells.

Advantage of the Invention

According to the present invention, a laminate for solar cells is provided, which facilitates production of solar cell modules, which does not require a crosslinking step and which is excellent in transparency, moisture-proofness, sealability, handleability (rigidity) and others, and a solar cell module produced by the use of the laminate. Specifically, the laminate for solar cells of the present invention is excellent in moisture-proofness and therefore can prevent solar cell elements from being degraded through moisture absorption and enables long-term use of solar cells even in high-moisture conditions. In addition, as excellent in transparency, the laminate secures power generation efficiency on the same level as that of solar cell modules produced by the use of an ordinary solar cell encapsulant material. Further, as excellent not only in heat resistance but also in sealability and handleability, the laminate can be widely used as a solar cell encapsulant material excellent in productivity in a process of solar cell module production.

Not requiring a crosslinking step, the laminate can enhance the productivity in a process of producing solar cell modules. Further, regarding the production equipment, the present invention is applicable not only to a batch-type production line but also to a roll-to-roll production line, and as a result, the present invention is expected to be effective for greatly reducing the production cost for solar cell modules.

BRIEF DESCRIPTION OF THE DRAWING

FIG. 1 This is a schematic cross-sectional view showing one example of the solar cell module of the present invention.

MODE FOR CARRYING OUT THE INVENTION

[Resin Layer (I)]
[Resin Layer (I)-1]

The resin layer (I)-1 contains an ethylene/α-olefin random copolymer (A) satisfying the above-mentioned requirement (a), and an ethylene/α-olefin block copolymer (B) satisfying the above-mentioned requirement (b), and has a role to express excellent sealability and heat resistance mainly for protecting solar cell elements (simply referred to as cells) and of excellent transparency for imparting sufficient power generation efficiency to solar cells.

(Ethylene/α-Olefin Random Copolymer (A))

Not specifically defined, the ethylene/α-olefin random copolymer (A) for use in the present invention may be any one satisfying the above-mentioned requirement (a), but in general, preferred is a random copolymer of ethylene with an α-olefin having from 3 to 20 carbon atoms. The α-olefin to copolymerize with ethylene here includes propylene, 1-butene, 1-pentene, 1-hexene, 1-heptene, 1-octene, 1-nonene, 1-decene, 3-methyl-butene-1,4-methyl-pentene-1, etc. In the present invention, propylene, 1-butene, 1-hexene and 1-octene are preferred as the α-olefin to copolymerize with ethylene from the viewpoint of the industrial availability, various properties and the economic potential thereof. One alone or two or more different types of α-olefins to copolymerize with ethylene may be used here either singly or as combined.

The content of the α-olefin to copolymerize with ethylene is not specifically defined so far as it satisfies the above-mentioned requirement (a). In general, the content is at least 2 mol % relative to the total monomer units in the ethylene/α-olefin random copolymer (A), and preferably at most 40 mol %, more preferably from 3 to 30 mol %, even more preferably from 5 to 25 mol %. Falling within the range, the comonomer may reduce the crystallinity of the copolymer and may therefore enhance the transparency thereof; and another advantage thereof is that the raw material pellets hardly block together. The type and the content of the α-olefin to copolymerize with ethylene may be determined through qualitative and quantitative analysis according to a known method, for example, using a nuclear magnetic resonance (NMR) apparatus or any other analyzer.

The ethylene/α-olefin random copolymer (A) may contain any other monomer unit derived from other monomers than α-olefins, so far as it satisfies the above-mentioned requirement (a). The additional monomer includes, for example, cyclic olefins, vinyl-aromatic compounds (styrene, etc.), polyene compounds, etc. The content of the additional monomer unit is preferably at most 20 mol % based on all the monomer units, 100 mol % in the ethylene/α-olefin random copolymer (A), more preferably at most 15 mol %. The configuration, the branched structure, the branching degree distribution and the molecular weight distribution of the ethylene/α-olefin random copolymer (A) are not specifically defined, so far as the copolymer satisfies the above-mentioned requirement (a). For example, a copolymer having long-chain branches could generally have good mechanical properties and have advantages in that its melt tension in molding into sheets is high and the calendering moldability thereof is good. A copolymer having a narrow molecular weight distribution, as produced through polymerization with a single-site catalyst, contains few low-molecular-weight components, and another advantage thereof is that the raw material pellets hardly block together.

Not specifically defined, the melt flow rate (MFR) of the ethylene/α-olefin random copolymer (A) for use in the present invention is generally from 0.5 to 100 g/10 min or so as MFR thereof (JIS K7210, temperature: 190° C., load: 21.18 N), more preferably from 2 to 50 g/10 min, even more preferably from 3 to 30 g/10 min. In this, MFR may be selected in consideration of the moldability and the workability in molding into sheets, the adhesiveness and the spreadability in sealing solar cell elements (simply referred to as cells), etc. For example, when sheets are produced through calender-molding, MFR of the copolymer to be used is preferably a relatively low value, concretely from 0.5 to 5 g/10 min or so in view of the handleability in peeling the sheet from molding rolls; but when sheets are produced through extrusion using a T-die, MFR of the copolymer is preferably from 2 to 50 g/10 min, more preferably from 3 to 30 g/10 min from the viewpoint of reducing the extrusion load and increasing the extrusion output. Further, from the viewpoint of the adhesiveness and the spreadability in sealing solar cell elements (simply referred to as cells), MFR of the copolymer to be used is preferably from 2 to 50 g/10 min, more preferably from 3 to 30 g/10 min.

The production method for the ethylene/α-olefin random copolymer (A) for use in the present invention is not specifically defined, for which is employable any known polymerization method using a known olefin polymerization catalyst. For example, there are mentioned a slurry polymerization method, a solution polymerization method, a bulk polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, since the ethylene/α-olefin random copolymer (A) is a relatively soft resin, and from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

The ethylene/α-olefin random copolymer (A) for use in the present invention must satisfy the above-mentioned requirement (a), or that is, the heat of crystal fusion of the copolymer (A), as measured at a heating rate of 10° C./min in differential scanning calorimetry, is from 0 to 70 J/g, preferably from 5 to 70 J/g, more preferably from 10 to 65 J/g. When the heat of crystal fusion thereof falls within the range from 0 to 70 J/g, the copolymer is preferred as capable of securing the flexibility and the transparency (total light transmission) of the laminate for solar cells. In particular, when the heat of crystal fusion thereof is at least 5 J/g, the copolymer is more preferred since the raw material pellets hardly block together. Some reference data of the heat of crystal fusion are shown here. Ordinary high-density polyethylene (HDPE) has from 170 to 220 J/g or so, and low-density polyethylene resin (LDPE) and linear low-density polyethylene (LLDPE) have from 100 to 160 J/g or so. The heat of crystal fusion may be measured at a heating rate of 10° C./min, using a differential scanning calorimeter and according to JIS K7122.

The crystal melting peak temperature of the ethylene/α-olefin random copolymer (A) for use in the present invention is not specifically defined, but is generally lower than 100° C. and may fall from 30 to 90° C. in many cases. Some reference data of the crystal melting peak temperature are shown here. Ordinary high-density polyethylene (HDPE) has from 130 to 145° C. or so, low-density polyethylene resin (LDPE) and linear low-density polyethylene (LDPE) and linear low-density polyethylene (LLDPE) have from 100 to 125° C. or so. Specifically, when measured alone at a heating rate of 10° C./min through differential scanning calorimetry, the ethylene/α-olefin random copolymer (A) for use in the present invention could hardly have a crystal melting peak temperature of 100° C. or higher and a heat of crystal fusion of from 5 to 70 J/g. The crystal melting peak temperature may be measured at a heating rate of 10° C./min, using a differential scanning calorimeter and according to JIS K7121.

Specific examples of the ethylene/α-olefin random copolymer (A) for use in the present invention include Dow Chemical's trade names "Engage" and "Affinity", Mitsui Chemical's trade names "TAFMER A" and "TAFMER P", and Japan Polyethylene's trade name "Karnel", etc.

(Ethylene-α-Olefin Block Copolymer (B))

Not specifically defined, the ethylene/α-olefin block copolymer (B) for use in the present invention may be any one satisfying the above-mentioned requirement (b), for which, in general, preferred is a block copolymer of ethylene and an α-olefin having from 3 to 20 carbon atoms. The α-olefin to copolymerize with ethylene includes propylene, 1-butene, 1-pentene, 1-hexene, 1-heptene, 1-octene, 1-nonene, 1-decene, 3-methyl-butene-1,4-methyl-pentene-1, etc. In the present invention, propylene, 1-butene, 1-hexene and 1-octene are preferably used as the α-olefin to copolymerize with ethylene, from the viewpoint of the industrial availability, various special properties and the economic potential thereof. One alone or two or more different types of α-olefins to copolymerize with ethylene may be used here either singly or as combined.

The ethylene/α-olefin block copolymer (B) may contain any other monomer unit derived from other monomers than α-olefins, so far as it satisfies the above-mentioned requirement (b). The additional monomer includes, for example, cyclic olefins, vinyl-aromatic compounds (styrene, etc.), polyene compounds, etc. The content of the additional monomer units is preferably at most 20 mol % based on all the monomer units, 100 mol % in the ethylene/α-olefin block copolymer (B), more preferably at most 15 mol %.

Not specifically defined, the block structure of the ethylene/α-olefin block copolymer (B) may be any one satisfying the above-mentioned condition (b), but preferred is a multi-block structure comprising at least two, preferably at least three segments or blocks differing from each other in point of the comonomer content, the crystallinity, the density, the crystal melting peak temperature (melting point Tm) or the glass transition temperature (Tg) thereof, from the viewpoint of attaining well-balanced flexibility, heat resistance, transparency and others. Concretely, there are mentioned a completely symmetric block structure, an asymmetric block structure, a tapered block structure (in which the proportion of the block structures gradually increases in the main chain), etc. Regarding the configuration of the copolymer having the multi-block structure and the production method for the copolymer, those described in detail in WO2005/090425, WO2005/090426, WO2005/090427 and others may be hereby incorporated by reference.

Next described in detail is the above-mentioned ethylene/α-olefin block copolymer having a multi-block structure for use in the present invention.

The ethylene/α-olefin block copolymer having a multi-block structure is favorably used in the present invention, and preferred is an ethylene/octene multi-block copolymer in which 1-octene is the comonomer, α-olefin. The block copolymer is preferably a multi-block copolymer that comprises at least two, nearly amorphous soft segments in which the proportion of the octene component copolymerized is large (about 15 to 20 mol %) relative to ethylene, and at least two, high-crystalline hard segments in which the proportion of the octene component copolymerized is small (less than about 2 mol %) relative to ethylene and which have a crystal melting peak temperature of from 100 to 145° C. By suitably controlling the chain length and the proportion of these soft segments and hard segments therein, the block copolymer can be made to satisfy both flexibility and heat resistance. Specific examples of the multi-block structure-having copolymer include Dow Chemical's trade name "Infuse".

Not specifically defined, the melt flow rate (MFR) of the ethylene/α-olefin block copolymer (B) for use in the present invention is generally from 0.5 to 100 g/10 min or so as MFR thereof (JIS K7210, temperature: 190° C., load: 21.18N), more preferably from 1 to 50 g/10 min, even more preferably from 1 to 30 g/10 min, still more preferably from 1 to 10 g/10 min.

In this, MFR may be selected in consideration of the moldability and the workability in molding into sheets, and the adhesiveness and the spreadability in sealing solar cell elements (simply referred to as cells), etc. Concretely, when sheets are produced through calender-molding, MFR of the copolymer to be used is preferably a relatively low value, concretely from 0.5 to 5 g/10 min or so in view of the handleability in peeling the sheet from molding rolls; but when sheets are produced through extrusion using a T-die, MFR of the copolymer is preferably from 1 to 30 g/10 min from the viewpoint of reducing the extrusion load and increasing the extrusion output. Further, from the viewpoint of the adhesiveness and the spreadability in sealing solar cell elements (simply referred to as cells), MFR of the copolymer to be used is preferably from 3 to 50 g/10 min.

The ethylene/α-olefin block copolymer (B) for use in the present invention must satisfy the above-mentioned requirement (b), or that is, the crystal melting peak temperature of the copolymer, as measured at a heating rate of 10° C./min in differential scanning calorimetry, is from 100 to 145° C., and the heat of crystal fusion thereof is from 5 to 70 J/g. Preferably, the crystal melting peak temperature of the copolymer is 105° C. or higher, more preferably 110° C. or higher, and the upper limit thereof is generally 145° C. Also preferably, the heat of crystal fusion of the copolymer is from 10 to 60 J/g, more preferably from 15 to 55 J/g. The measuring methods for the crystal melting peak temperature and the heat of crystal fusion are as described above.

In general, solar cell modules are heated up to from 85° C. to 90° C. or so by the heat generated during power generation or by the radiation heat of sunlight; however, so far as the crystal melting peak temperature is 100° C. or higher, the laminate for solar cells of the present invention can secure the necessary heat resistance and therefore the temperature range is favorable here. On the other hand, when the upper limit of the temperature is 145° C., then it is favorable since solar cell elements can be readily sealed up in the sealing process with the laminate of the present invention without requiring any too high temperature. When the heat of crystal fusion falls within a range of from 5 to 70 J/g, then the laminate for solar cells of the present invention can favorably secure flexibility and transparency (total light transmission) and the raw pellets hardly block together.

(Resin Layer (I)-1)

The resin layer (I)-1 is a resin layer containing the above-mentioned ethylene/α-olefin random copolymer (A) and the above-mentioned ethylene/α-olefin block copolymer (B). Here the type of the α-olefin for use in the copolymer (A) and the copolymer (B) may be the same or different. Preferably, however, the α-olefin is the same in the two since the miscibility of the two in mixing is high and the transparency of the laminate for solar cells can increase, or that is, the photoelectric conversion efficiency of solar cells using the laminate can increase.

The content of the ethylene/α-olefin random copolymer (A) and the content of the ethylene/α-olefin block copolymer (B) in the resin layer (I)-1 are preferably from 50 to 99% by mass and from 1 to 50% by mass, respectively, from the viewpoint of attaining well-balanced flexibility, heat resistance and transparency, more preferably from 60 to 98% by mass and from 2 to 40% by mass, respectively, even more preferably from 70 to 97% by mass and from 3 to 30% by mass, respectively. The blend (content) ratio by mass of the ethylene/α-olefin random copolymer (A) and the ethylene/α-olefin block copolymer (B) is not also specifically defined, but is preferably (A)/(B) =(99 to 50)/(1 to 50), more preferably (98 to 60)/(2 to 40), even more preferably (97 to 70)/(3 to 30), still more preferably (97 to 80)/(3 to 20), further more preferably (97 to 90)/(3 to 10). The total of (A) and (B) is 100 parts by mass. The blend (content) ratio by mass falling within the range is preferable as readily providing the laminate for solar cells well-balanced in flexibility, heat resistance and transparency.

[Resin Layer (I)-2]

The resin layer (I)-2 is a resin layer containing a silane-modified ethylene-based resin (X). The resin layer (I)-2 includes a resin layer comprising a silane-modified ethylene-based resin (X) as the main ingredient thereof, and a resin layer comprising a mixture of a silane-modified etylene-based resin (A) and a polyethylene-based resin (Y) as the main ingredient thereof. In addition, the resin layer (I)-2 has a role to express mainly the function as a surface layer, a encapsulant layer or an adhesive layer with respect to the laminate for solar cells of the present invention. Accordingly, at least one outermost layer of the laminate for solar cells of the present invention must be the resin layer (I)-2.

In this description, "main ingredient" is intended to contain any other ingredient within a range not interfering with the action and the effect of the resin that constitute each resin layer of the laminate for solar cells of the present invention. Further, the term generally means the ingredient that accounts for at least 50 parts by mass, preferably at least 65 parts by mass, more preferably at least 80 parts by mass and at most 100 parts by mass relative to 100 parts by mass of all the constitutive ingredients of the resin composition, though not limiting the concrete content thereof. The same shall apply hereinunder.

<Silane-Modified Etylene-based Resin (X)>

The silane-modified ethylene-based resin (X) for use in the present invention is obtained generally by melt-mixing a polyethylene-based resin, a vinylsilane compound and a radical generator at a high temperature (160° C. to 220° C. or so) for graft polymerization.

(Polyethylene-based Resin)

Not specifically defined, the polyethylene-based resin concretely includes low-density polyethylene, middle-density polyethylene, high-density polyethylene, ultra-low-density polyethylene, and linear low-density polyethylene. One alone or two or more of these may be used here either singly or as combined.

In the present invention, preferred is use of a polyetylene-based resin having a low density as bettering the transparency and the flexibility of the resin layer. Concretely, preferred is a polyetylene-based resin having a density of from 0.850 to 0.920 g/cm³, and especially preferred is a linear low-density polyethylene having a density of from 0.860 to 0.880 g/cm³. A polyetylene-based resin having a low density may be combined with a polyetylene-based resin having a high density. Combining the two is preferred as capable of relatively easily controlling the balance of transparency, flexibility and heat resistance of the resin layer.

As the polyethylene-based resin having a low density, which is favorably used in the present invention, generally mentioned is a random copolymer of ethylene and an α-olefin having a carbon number of from 3 to 20 . The α-olefin to copolymerize with ethylene includes propylene, 1-butene, 1-pentene, 1-hexene, 1-heptene, 1-octene, 1-nonene, 1-decene, 3-methyl-butene-1, 4-methyl-pentene-1, etc. As the α-olefin in the present invention, preferred is use of propylene, 1-butene, 1-hexene or 1- octene from the viewpoint of the industrial availability, various properties and the economic potential thereof. One alone or two or more different types of α-olefins to copolymerize with ethylene may be used here either singly or as combined.

The content of the α-olefin to copolymerize with ethylene may be generally at least 2 mol % and preferably at most 40 mol %, more preferably from 3 to 30 mol %, even more preferably from 5 to 25 mol % relative to the total monomer units in the ethylene/α-olefin random copolymer. Falling within the range, the comonomer may reduce the crystallinity of the copolymer and may therefore enhance the transparency thereof; and another advantage thereof is that the raw material pellets are prevented from blocking together. The type and the content of the α-olefin to copolymerize with ethylene may be determined through qualitative and quantitative analysis according to a known method, for example, using a nuclear magnetic resonance (NMR) apparatus or any other analyzer.

The ethylene/α-olefin random copolymer may contain any other monomer unit derived from other monomers than α-olefins. The additional monomer includes, for example, cyclic olefins, vinyl-aromatic compounds (styrene, etc.), polyene compounds, etc. The content of the additional monomer unit is preferably at most 20 mol % based on all the monomer units, 100 mol % in the ethylene/α-olefin random copolymer, more preferably at most 15 mol %. The configuration, the branched structure, the branching degree distribution and the molecular weight distribution of the ethylene/α-olefin random copolymer are not specifically defined. For example, a copolymer having long-chain branches could generally have good mechanical properties and have advantages in that its melt tension in molding into sheets is high and the calendering moldability thereof is good. A copolymer having a narrow molecular weight distribution, as produced through polymerization with a single-site catalyst, contains few low-molecular-weight components, and another advantage thereof is that the raw material pellets hardly block together.

Not specifically defined, the melt flow rate (MFR) of the ethylene/α-olefin random copolymer is generally from 0.1 to 100 g/10 min or so as MFR thereof (JIS K7210, temperature: 190° C., load: 21.18 N), and is preferably from 0.3 to 10 g/10 min in view of the moldability and various properties thereof.

The production method for the ethylene/α-olefin random copolymer is not specifically defined, for which is employable any known polymerization method using a known olefin polymerization catalyst. For example, there are mentioned a slurry polymerization method, a solution polymerization method, a bulk polymerization method, a vapor-phase polymerization method or the like using a multi-site catalyst such as typically a Ziegler-Natta catalyst, or a single-site catalyst such as typically a metallocene catalyst or a post-metallocene catalyst, and a bulk polymerization method using a radical initiator, etc. In the present invention, the ethylene/α-olefin random copolymer having a low density and preferred for use herein is a relative soft resin, and therefore, from the viewpoint of attaining easy granulation (pelletization) after polymerization and from the viewpoint of preventing the raw material pellets from blocking together, preferred is a polymerization method using a single-site catalyst, in which a raw material can be polymerized to give a polymer having few low-molecular-weight components and having a narrow molecular weight distribution.

(Vinylsilane Compound)

Not specifically defined, the vinylsilane compound may be any one capable of graft-polymerizing with the above-mentioned polyetylene-based resin. For example, usable here is at least one selected from a group consisting of vinyltrimethoxysilane, vinyltriethoxysilane, vinyltripropoxysilane, vinyltriisopropoxysilane, vinyltributoxysilane, vinyltripentyloxysilane, vinyltriphenoxysilane, vinyltribenzyloxysilane, vinyltrimethylenedioxysilane, vinyltriethylenedioxysilane, vinylpropionyloxysilane, vinyltriacetoxysilane, and vinyltricarboxysilane. In the present invention, preferred is use of vinyltrimethoxysilane from the viewpoint of the reactivity, the adhesiveness and the color tone of the modified resin.

Not specifically defined, the amount of the vinylsilane compound to be added may be generally from 0.01 to 10.0 parts by mass or so, relative to 100 parts by mass of the polyetylene-based resin used, but is preferably from 0.3 to 8.0 parts by mass, more preferably from 1.0 to 5.0 parts by mass.

(Radical Generator)

The radical generator is not specifically defined. For example, there are mentioned organic peroxides including hydroperoxides such as diisopropylbenzene hydroperoxide, 2,5-dimethyl-2,5-di(hydroperoxy)hexane, etc.; dialkyl peroxides such as di-t-butyl peroxide, t-butylcumyl peroxide, dicumyl peroxide, 2,5-dimethyl-2,5-di(t-butylperoxy) hexane, 2,5-dimethyl-2,5-di(t-peroxy)hexyne-3, etc.; diacyl peroxides such as bis-3,5,5-trimethylhexanoyl peroxide, octanoyl peroxide, benzoyl peroxide, o-methylbenzoyl peroxide, 2,4-dichlorobenzoyl peroxide, etc.; peroxyesters such as t-butylperoxy acetate, t-butylperoxy-2-ethyl hexanoate, t-butylperoxy pivalate, t-butylperoxy octanoate, t-butylperoxyisopropyl carbonate, t-butylperoxy benzoate, di-t-butylperoxy phthalate, 2,5-dimethyl-2,5-di(benzoylperoxy) hexane, 2,5-dimethyl-2,5-di(benzoylperoxy)hexyne-3, etc.; ketone peroxides such as methyl ethyl ketone peroxide, cyclohexanone peroxide, etc.; as well as azo compounds such as azobisisobutyronitrile, azobis(2,4-dimethylvaleronitrile), etc.

Not specifically defined, the amount of the radical generator to be added may be generally from 0.01 to 5.0 parts by mass relative to 100 parts by mass of the polyetylene-based resin used, and is preferably from 0.02 to 1.0 part by mass, more preferably from 0.03 to 0.5 parts by mass. Also preferably, the remaining amount of the radical generator is at most 0.001% by mass in the resin layer constituting the laminate for solar cells of the present invention, and the gel fraction in the layer is at most 30%.

Preferably, the silane-modified etylene-based resin (X) for use in the present invention and the resin layer does not substantially contain a silanol condensation catalyst of promoting the condensation reaction between silanols. Specific examples of the silanol condensation catalyst include dibutyltin diacetate, dibutyltin dilaurate, dibutyltin dioctate, dioctyltin dilaurate, etc. Here the wording "substantially does not contain" means that the catalyst content is at most 0.05 parts by mass relative to 100 parts by mass of the resin, preferably at most 0.03 parts by mass.

The reason why it is desirable that the resin or the resin layer does not substantially contain a silanol condensation catalyst is because, in the present invention, the silanol crosslinking reaction is not positively attained and the intended adhesiveness is expressed through the interaction such as hydrogen bonding or covalent bonding between the polar group such as the silanol group grafted with the polyethylene-based resin used and the adherend (glass, various plastic sheets (preferred are those surface-treated through corona treatment to have a wetting index of at least 50 mN/m), metals, etc.).

(Silane-Modified Etylene-based Resin (X))

As described above, the silane-modified etylene-based resin (A) for use in the present invention is obtained generally by melt-mixing the above-mentioned polyetylene-based resin and a vinylsilane compound and a radical generator at a high temperature (160° C. to 220° C. or so) for graft polymerization. Accordingly, the preferred ranges of the density and MFR of the silane-modified etylene-based resin (X) for use in the present invention could be the same as the preferred ranges of the density and MFR of the above-mentioned polyetylene-based resin.

Specific examples of the silane-modified etylene-based resin (X) for use in the present invention include Mitsubishi Chemical's trade name, "LINKLON".

The resin layer (I)-2 may be a resin layer comprising the silane-modified etylene-based resin (X) as the main ingredient thereof, or a resin layer comprising a mixture of the silane-modified etylene-based resin (X) and a polyetylene-based resin (Y) as the main ingredient thereof. As described above, the silane-modified etylene-based resin (X) may be obtained by melt-mixing a polyetylene-based resin and a vinylsilane compound and a radical generator at a high temperature for graft polymerization; however, in the process, since a radical generator is used, the polyetylene-based resin may be partially crosslinked to give a gel whereby fish eyes may mix in the resin, or the vinylsilane compound and the radical generator may remain as unreacted therein. Consequently, in the present invention, preferred is a resin layer containing a mixture of the silane-modified etylene-based resin (X) and a polyetylene-based resin (Y) as the main ingredient thereof. The mixture enhances the economic potential of the present invention and another advantage thereof is that various properties such as flexibility, transparency and heat resistance of the resin layer can be readily controlled.

Here the polyetylene-based resin (Y) is not specifically defined. As mixed with a silane-modified etylene-based resin (X), the resin (Y) controls the content of the silane-modified etylene-based resin (X) in the resin layer (I)-2, and controls various properties such as flexibility, transparency, sealability and heat resistance of the resin layer (I)-2. Concretely, the resin (Y) includes the same ones as those to be used for the polyetylene-based resin in obtaining the silane-modified etylene-based resin (X), or that is, low-density polyethylene, middle-density polyethylene, high-density polyethylene, ultra-low-density polyethylene and linear low-density polyethylene. One alone or two or more different types of these may be used here either singly or as combined.

Not specifically defined, the melt flow rate (MFR) of the polyetylene-based resin (Y) for use in the present invention is generally from 0.5 to 100 g/10 min or so as MFR thereof (JIS K7210, temperature: 190° C., load: 21.18 N), preferably from 2 to 50 g/10 min, more preferably from 3 to 30 g/10 min. In this, MFR may be selected in consideration of the moldability and the workability in molding into sheets, the adhesiveness and the spreadability in sealing solar cell elements (simply referred to as cells), etc. For example, when sheets are produced through calender-molding, MFR of the resin is preferably a relatively low value, concretely from 0.5 to 5 g/10 min or so in view of the handleability in peeling the sheet from molding rolls; but when sheets are produced through extrusion using a T-die, MFR of the resin is preferably from 2 to 50 g/10 min, more preferably from 3 to 30 g/10 min from the viewpoint of reducing the extrusion load and increasing the extrusion output. Further, from the viewpoint of the adhesiveness and the spreadability in sealing solar cell elements (simply referred to as cells), MFR of the resin to be used is preferably from 2 to 50 g/10 min, more preferably from 3 to 30 g/10 min.

In the present invention, the polyetylene-based resin (Y) may be the same resin as the polyetylene-based resin for use in obtaining the silane-modified etylene-based resin (X), or may differ from the latter; however, from the viewpoint of the miscibility and the transparency in mixing them, the two are preferably the same resin. Also in the present invention, preferred is use of a polyetylene-based resin having a low density as bettering the transparency and the flexibility of the resin layer. Concretely, preferred is a polyetylene-based resin having a density of from 0.850 to 0.920 g/cm$^3$, and more preferred is a linear low-density polyethylene having a density of from 0.860 to 0.880 g/cm$^3$. Further, in the linear low-density polyethylene, it is especially desirable that the type of the comonomer, α-olefin is the same as that for the polyetylene-based resin to be used in obtaining the silane-modified etylene-based resin (X).

In the present invention, specific examples of the preferred polyetylene-based resin having a low density include Dow Chemical's trade names "Engage", "Affinity" and "Infuse", Mitsui Chemical's trade names "TAFMER A" and "TAFMER P", and Japan Polyethylene's trade name "Karnel", etc.

In case where the resin layer (I)-2 is a resin layer comprising a mixture of the silane-modified etylene-based resin (X) and the polyetylene-based resin (Y) as the main ingredient thereof, the blend ratio by mass is not specifically defined. In this, the ratio of silane-modified etylene-based resin (X)/polyetylene-based resin (Y) may be (1 to 99)/(99 to 1), preferably (2 to 70)/(98 to 30), more preferably (3 to 40)/(97 to 60). Falling within the range, the content of the silane-modified etylene-based resin (X) in the resin layer (I)-2 is easy to control, and another advantage is that the properties such as the flexibility, the transparency, the sealability and the heat resistance of the layer as a surface layer or a encapsulant layer are easy to control while securing the main role of the resin layer (I)-2 to keep the function as an adhesive layer.

In the laminate for solar cells of the present invention, the resin layer (I)-2 has a role to mainly express the function as a surface layer, a encapsulant layer or an adhesive layer. Accordingly, it is desirable that the resin for use for the resin layer (I)-2 has flexibility. On the other hand, the resin layer (I)-2 is required to have the ability to prevent blocking by softening as a surface layer. Not specifically defined in the present invention, it is desirable that the Vicat softening temperature of the resin layer (I)-2 is not higher than 60° C., more preferably from 30° C. to lower than 60° C., even more preferably from 35° C. to 55° C. Falling within the range, the resin layer (I)-2 is favorable as cable of fully securing the flexibility thereof and as hardly causing blocking in ordinary storage environments (temperature 30° C., humidity 50% or so). The Vicat softening temperature may be measured according to JIS K7206. Concretely, while a total load of 10 N (method A) is given to a test piece put in a hot bath, via a needle-like indenter having a tip cross section of 1 mm$^2$ and set vertically to the test piece, the heat-transfer medium is heated at a rate of 50° C./hr, whereupon the temperature at the time at which the indenter tip has come in the test piece by 1 mm is measured, and this is the Vicat softening temperature of the test piece.

The mixing method in the case of using a mixture of a silane-modified etylene-based resin (X) and a polyetylene-based resin (Y) for the resin layer (I)-2 is not specifically defined. For example, the resins may be dry-blended and fed into a hopper; or all the materials may be previously melt-mixed and pelletized, and then the pellets may be fed thereinto. In the present invention, the vinylsilane compound and the radical generator added in producing the silane-modified etylene-based resin (X) may remain in the resin as unreacted, as described above; and therefore, in mixing the silane-modified etylene-based resin (X) and a polyetylene-based resin (Y), it is desirable that the volatile component is removed via a vacuum vent.

The thickness of the resin layer (I) is not specifically defined. From the viewpoint of the sealability and the economic potential for solar cell elements (simply referred to as cells), the thickness is preferably from 0.02 to 0.7 mm, more preferably from 0.05 to 0.6 mm.

[Resin Layer (II)]

The resin layer (II) is a resin layer arranged on at least one side of the resin layer (I) and containing an etylene-based polymer (C), of which the crystal melting peak temperature, as measured at a heating rate of 10° C./min in differential scanning calorimetry, is from 100 to 145° C. and the heat of crystal fusion is from 120 to 190 J/g (requirement (c)), and a nucleating agent (D). The resin layer (II) has a role to mainly impart to the laminate for solar cells of the present invention, excellent moisture-proofness (water vapor barrier property) for preventing solar cell elements (simply referred to as cells) and wiring from being degraded by moisture, handleability (rigidity) in producing solar cell modules, rigidity (toughness) necessary for flexible solar cell modules, and excellent transparency for making solar cells express sufficient power generation efficiency.

(Etylene-based Polymer (C))

Not specifically defined, the etylene-based polymer (C) for use in the laminate for solar cells of the present invention may be any one satisfying the thermal properties of the above-mentioned requirement (c). Preferred is an ethylene homopolymer, a copolymer of ethylene and an α-olefin having a carbon number of from 3 to 20, or a mixture thereof. The α-olefin to copolymerize with ethylene includes propylene, 1-butene, 1-pentene, 1-hexene, 1-heptene, 1-octene, 1-nonene, 1-decene, 3-methyl-butene-1,4-methyl-pentene-1, etc. As the α-olefin to copolymerize with ethylene in the present invention, preferred is use of propylene, 1-butene, 1-hexene or 1-octene from the viewpoint of the industrial availability, various properties and the economic potential thereof. One alone or two or more different types of α-olefins to copolymerize with ethylene may be used here either singly or as combined. In the present invention, preferred is an ethylene homopolymer or a copolymer of ethylene and at least one, preferably at least two selected from 1-butene, 1-hexene and 1-octene, which satisfies the above-mentioned thermal properties, since the homopolymer or the copolymer is, as combined with the nucleating agent (D), able to efficiently impart to the resin layer (II), various properties of excellent moisture-proofness (water vapor barrier property) for preventing solar cell elements (simply referred to as cells) and wiring from being degraded by moisture, handleability (rigidity) in producing solar cell modules, rigidity (toughness) necessary for flexible solar cell modules, and excellent transparency for making solar cells express sufficient power generation efficiency.

In case where a copolymer of ethylene and an α-olefin is used, the content of the α-olefin is preferably from 0.1 to 3.0% by mass relative to the total monomer units in the ethylene/α-olefin copolymer, more preferably from 0.3% by mass to 2.8% by mass, even more preferably 0.5% by mass to 2.6% by mass. Especially preferably, the total ratio of butene-1, hexene-1 and octene-1 in the copolymer falls within the range. When the content of the α-olefin falls within the range, then it is favorable as capable of providing a laminate for solar cells excellent in balance of moisture-proofness, transparency, heat resistance and rigidity.

The catalyst for the polymerization to give the etylene-based polymer (C) is not specifically defined. For example, there are mentioned multi-site catalysts such as typically Ziegler-Natta catalysts comprising titanium chloride and an organic aluminium compound, and Phillips catalysts containing a chromium compound such as chromium oxide; and single-site catalysts such as typically metallocene catalysts and post-metallocene catalysts, etc. In the present invention, preferred is use of a single-site catalyst for the reason to be mentioned below.

Here the ethylene homopolymer and the ethylene/α-olefin copolymer to be produced through polymerization with a single-site catalyst has a small molecular weight distribution index (Mw/Mn) and has a relatively uniform molecular length, and therefore can form fine crystals when the nucleating agent (D) is added thereto; and for these reasons, the homopolymer or the copolymer is effective for efficiently enhancing transparency and moisture-proofness. From these, the molecular weight distribution index (Mw/Mn) of the etylene-based polymer (C) is preferably from 2.5 to 5.0, more preferably from 2.6 to 4.8, even more preferably from 2.8 to 4.5, still more preferably from 3.0 to 4.0. The molecular weight distribution index (Mw/Mn) may be derived from the weight-average molecular weight (Mw) and the number-average molecular weight (Mn) of the polymer according to a known method, for example, using a high-temperature GPC system.

Examples of the single-site catalyst include a metallocene catalyst containing a combination of a metallocene compound and methylaluminoxane. The properties of the ethylene homopolymer and the ethylene/α-olefin copolymer to be produced through polymerization with the single-site catalyst are that, in addition to the narrow molecular weight distribution as mentioned above, the heat of crystal fusion of the polymer is lower than that of other resins produced through polymerization with a multi-site catalyst when the two having the same density are compared with each other.

Also preferably, the density of the etylene-based polymer (C) is from 0.910 to 0.948 g/cm$^3$, more preferably from 0.915 g/cm$^3$ to 0.947 g/cm$^3$, even more preferably from 0.920 g/cm$^3$ to 0.942 g/cm$^3$. When the density falls within the range, it is favorable since the polymer can impart to the laminate for solar cells of the present invention, well-balanced and excellent moisture-proofness, transparency, heat resistance and rigidity.

The etylene-based polymer (C) for use in the present invention must have specific thermal properties (c), or that is, the crystal melting peak temperature of the polymer, as measured at a heating rate of 10° C./min in differential scanning calorimetry, is from 100 to 145° C., and the heat of crystal fusion thereof is from 120 to 190 J/g. More preferably, the crystal melting peak temperature of the polymer is 105° C. or higher, even more preferably 110° C. or higher, and the upper limit thereof is 145° C. Also preferably, the heat of crystal fusion of the polymer is from 130 to 185 J/g, more preferably from 140 to 183 J/g. When the crystal melting peak temperature and the heat of crystal fusion each fall within the above range, it is favorable since the polymer is, as combined with the nucleating agent (D), able to impart excellent moisture-proofness, transparency and rigidity to the laminate for solar cells of the present invention. The crystal melting peak temperature and the heat of crystal fusion can be measured according to JIS K7121 and JIS K7122, respectively, using a differential scanning calorimeter.

Not specifically defined, the melt flow rate (MFR) of the etylene-based polymer (C) is generally from 0.1 to 100 g/10 min or so as MFR thereof (JIS K7210, temperature: 190° C., load: 21.18 N), preferably from 0.3 to 10 g/10 min in view of the moldability and various properties thereof.

Specific examples of the etylene-based polymer (C) includes Asahi Kasei Chemicals' trade name "CREOLEX", TOTAL PETROCHEMICALS' trade name "Lumicene" and Ube-Maruzen Polyethylene's trade name "UMERIT" produced through polymerization with a single-site catalyst; and Asahi Kasei Chemicals' trade name "Suntec HD" and Japan Polyethylene" trade name "Novatec HD" produced through polymerization with a multi-site catalyst.

(Nucleating Agent (D))

Not specifically defined in point of the type thereof, the nucleating agent (D) for use in the present invention may be any one effective mainly for increasing transparency through reduction in the crystal size of the etylene-based polymer (C), for increasing the heat of crystal fusion of the polymer and for enhancing the rigidity thereof. For example, there are mentioned dibenzylidene sorbitol (DBS) compounds, 1,3-O-bis(3,4-dimethylbenzylidene) sorbitol, dialkylbenzylidene sorbitols, diacetals of sorbitol having at least one chlorine or bromine substituent, di(methyl or ethyl-substituted benzylidene) sorbitols, bis(3,4-dialkylbenzylidene) sorbitols having a substitute to form a carbon ring, aliphatic, alicyclic and aromatic carboxylic acids, dicarboxylic acids or polybasic polycarboxylic acids, and metal salt compounds of organic acids with corresponding anhydrides and metal salt, cyclic bisphenol phosphate, dicyclic dicarboxylic acids and salt compounds such as disodium bicycle[2.2.1] heptene-dicarboxylic acid, etc., saturated salt or organic salt compounds of bicyclic decarboxylates such as bicycle [2.2.1]heptane-dicarboxylate, etc., diacetal compounds such as 1,3:2,4-O-dibenzylidene-D-sorbitol, 1,3:2,4-bis-O-(m-methylbenzylidene)-D-sorbitol, 1,3:2,4-bis-O-(m-ethylbenzylidene)-D-sorbitol, 1,3:2,4-bis-O-(m-isopropylbenzylidene)-D-sorbitol, 1,3:2,4-bis-O-(m-n-propylbenzylidene)-D-sorbitol, 1,3:2,4-bis-O-(m-n-butylbenzylidene)-D-sorbitol, 1,3:2,4-bis-O-(p-methylbenzylidene)-D-sorbitol, 1,3:2,4-bis-O-(p-ethylbenzylidene)-D-sorbitol, 1,3:2,4-bis-O-(p-isopropylbenzylidene)-D-sorbitol, 1,3:2,4-bis-O-(p-n-propylbenzylidene)-D-sorbitol, 1,3:2,4-bis-O-(p-n-butylbenzylidene)-D-sorbitol, 1,3:2,4-bis-O-(2,3-dimethylbenzylidene)-D-sorbitol, 1,3:2,4-bis-O-(2,4-dimethylbenzylidene)-D-sorbitol, 1,3:2,4-bis-O-(2,5-dimethylbenzylidene)-D-sorbitol, 1,3:2,4-bis-O-(3,4-dimethylbenzylidene)-D-sorbitol, 1,3:2,4-bis-O-(3,5-dimethylbenzylidene)-D-sorbitol, 1,3:2,4-bis-O-(2,3-diethylbenzylidene)-D-sorbitol, 1,3:2,4-bis-O-(2,4-diethylbenzylidene)-D-sorbitol, 1,3:2,4-bis-O-(2,5-diethylbenzylidene)-D-sorbitol, 1,3:2,4-bis-O-(3,4-diethylbenzylidene)-D-sorbitol, 1,3:2,4-bis-O-(3,5- diethylbenzylidene)-D-sorbitol, 1,3:2,4-bis-O-(2,4,5-trimethylbenzylidene)-D-sorbitol, 1,3:2,4-bis-O-(3,4,5-trimethylbenzylidene)-D-sorbitol, 1,3:2,4-bis-O-(2,4,5-triethylbenzylidene)-D-sorbitol, 1,3:2,4-bis-O-(3,4,5-triethylbenzylidene)-D-sorbitol, 1,3:2,4-bis-O-(p-methyloxycarbonylbenzylidene)-D-sorbitol, 1,3:2,4-bis-O-(p-ethyloxycarbonylbenzylidene)-D-sorbitol, 1,3:2,4-bis-O-(p-isopropyloxycarbonylbenzylidene)-D-sorbitol, 1,3:2,4-bis-O-(o-n-propyloxycarbonylbenzylidene)-D-sorbitol, 1,1,3:2,4-bis-O-(o-n-butylbenzylidene)-D-sorbitol, 1,3:2,4-bis-O-(o-chlorobenzylidene)-D-sorbitol, 1,3:2,4-bis-O-(p-chlorobenzylidene)-D-sorbitol, 1,3:2,4-bis-O-[(5,6,7,8-tetrahydro-1-naphthalene)-1-methylene]-D-sorbitol, 1,3:2,4-bis-O-[(5,6,7,8-tetrahydro-2-naphthalene)-1-methylene]-D-sorbitol, 1,3-O-benzylidene-2,4-O-p-methylbenzylidene-D-sorbitol, 1,3-O-p-methylbenzylidene-2,4-O-benzylidene-D-sorbitol, 1,3-O-benzylidene-2,4-O-p-ethylbenzylidene-D-sorbitol, 1,3-O-p-ethylbenzylidene-2,4-O-benzylidene-D-sorbitol, 1,3-O-benzylidene-2,4-O-p-chlorobenzylidene-D-sorbitol, 1,3-O-p-chlorobenzylidene-2,4-O-benzylidene-D-sorbitol, 1,3-O-benzylidene-2,4-O-(2,4-dimethylbenzylidene)-D-sorbitol, 1,3-O-(2,4-dimethylbenzylidene)-2,4-O-benzylidene-D-sorbitol, 1,3-O-benzylidene-2,4-O-(3,4-dimethylbenzylidene)-D-sorbitol, 1,3-O-(3,4-dimethylbenzylidene)-2,4-O-benzylidene-D-sorbitol, 1,3-O-p-methylbenzylidene-2,4-O-p-ethylbenzylidene-sorbitol, 1,3-p-ethylbenzylidene-2,4-p-methylbenzylidene-D-sorbitol, 1,3-O-p-methylbenzylidene-2,4-O-p-chlorobenzylidene-D-sorbitol, 1,3-O-p-chlorobenzylidene-2,4-O-p-methylbenzylidene-D-sorbitol, etc., sodium 2,2'-methylene-bis(4,6-di-tert-butylphenyl)phosphate, aluminium bis[2,2'-methylene-bis(4,6-di-tert-butylphenyl)phosphate], 2,2-methylenebis(4,6-di-tert-butylphenyl)sodium phosphate, as well as fatty acids such as caproic acid, enanthic acid, caprylic acid, pelargonic acid, capric acid, undecanoic acid, lauric acid, tridecenoic acid, myristic acid, pentadecanoic acid, palmitic acid, margaric acid, stearic acid, nonadecanoic acid, arachic acid, behenic acid, montanic acid, etc., fatty acid amides such as oleylamide, erucamide, stearamide, behenamide, etc., fatty acid metal salts such as magnesium stearate, zinc stearate, calcium stearate, etc., inorganic particles of silica, talc, kaolin, calcium carbide, etc., glycerol, higher fatty acid esters such as glycerin monoester, etc., and their analogues.

In the present invention, especially preferred are fatty acid amides such as oleylamide, erucamide, stearamide, behenamide or the like, and fatty acid metal salts such as magnesium stearate, zinc stearate, calcium stearate or the like, from the viewpoint of the effect thereof for enhancing transparency and rigidity.

Specific examples of the nucleating agent (D) include New Japan Chemical's trade name "GEL ALL D" series, ADEKA's trade name "Adeka Stab", Milliken Chemical's trade names "Millad" and "Hyperform", BASF's trade name "IRGACLEAR", etc. As the master batch of the nucleating agent, there are mentioned Riken Vitamin's trade name "Rikemaster CN", Milliken Chemical's trade name "Hyperform Concentrate", etc. Of those, Milliken Chemical's trade names "Hyperform HPN-20E" and "Hyperform Concentrate HL3-4", and Riken Vitamin's trade names "Rikemaster CN-001" and "Rikemaster CN-002" are mentioned as those having an especially high effect of enhancing transparency.

(Olefin-Miscible Resin (E))

Incorporating an olefin-miscible resin (E) into the resin layer (II) is preferred, as further enhancing the moisture-proofness and the transparency of the laminate for solar cells of the present invention.

As the olefin-miscible resin (E), for example, there may be mentioned one or more resins selected from a group consisting of petroleum resins, terpene resins, coumarone-indene resins, rosin resins, and their hydrogenated derivatives. In the present invention, preferred is use of petroleum resins or terpene resins for the reasons to be mentioned below.

The petroleum resins include, for example, alicyclic petroleum resins from cyclopentadiene or its dimer, aromatic petroleum resins from C9 component, etc.

The terpene resins include, for example, terpene-phenol resins from β-pinene, etc.

The coumarone-indene resins include, for example, coumarone-indene copolymers, coumarone-indene-styrene copolymers, etc.

The rosin resins include, for example, rosin resins such as gum rosin, wood rosin, etc., esterified rosin resins modified with glycerin, pentaerythritol or the like, etc.

As the olefin-miscible resin (E), preferred is use of hydrogenated derivatives, especially hydrogenated petroleum resins or hydrogenated terpene resins having a hydrogen addition ratio (hereinafter this may be abbreviated as a hydrogenation ratio—this may be obtained from the proportion of the unsaturated double bond of conjugated diene based on the phenyl group in $^1$H-NMR spectrum) of at least 95% and substantially not containing a polar group such as a hydroxyl group, a carboxyl group, a halogen atom or the like, or an unsaturated bond such as a double bond or the like, from the viewpoint of miscibility, color tone, thermal stability and wet heat resistance in mixing with the above-mentioned etylene-based polymer (C).

In the laminate for solar cells of the present invention, the softening temperature Ts(E) of the olefin-miscible resin (E), as measured according to JIS K2207, is preferably not higher than "Tc(C)+5° C." where Tc(C) is the crystallization peak temperature of the etylene-based polymer (C) measured at a cooling rate of 10° C./min in differential scanning calorimetry according to JIS K7121, more preferably, not higher than "Tc (C)+3° C.", even more preferably not higher than "Tc(C)+2° C.", still more preferably not higher than Tc(C), further more preferably not higher than "Tc(C)-5° C.". The lower limit of Ts(E) is 80° C. The upper limit of the softening temperature Ts(E) satisfying the above-mentioned requirement is preferred, since in the etylene-based polymer (C) crystallization process, the degree of freedom of the molecular chains of the olefin-miscible resin (E) is high and therefore the crystallization of the etylene-based polymer (C) is retarded little and fine crystals are well formed, thereby providing a laminate for solar cells excellent in moisture-proofness and transparency. The lower limit of the softening temperature Ts(E) of the olefin-miscible resin (E) of 80° C. or higher, preferably 90° C. or higher is preferred, since the raw material blocks little in molding, and the resin hardly bleeds out on the surface of the laminate for solar cells in secondary working or in transportation or in use.

The softening point Ts(E) of the olefin-miscible resin (E) may be controlled to be a desired one mainly by selecting the molecular weight thereof.

Specific examples of the olefin-miscible resin (E) include Mitsui Chemical's trade names "Hirez" and "PETROSIN", Arakawa Chemical Industry's trade name "Arkon", Yasuhara Chemical's trade name "Clearon", Idemitsu Kosan's trade name "I-MARV", Tonex's "Escorez", etc.

(Cyclic Olefin-Based Resin (F))

Further incorporating a cyclic olefin-based resin (F) into the resin layer (II) is preferred for further enhancing transparency.

The cyclic olefin-based resin (F) for use in the present invention includes (i) polymers prepared by optionally hydrogenating ring-opened (co)polymers of cyclic olefins, (ii) addition (co)polymers of cyclic olefins, (iii) random copolymers of cyclic olefins and α-olefins such as ethylene, propylene, etc., (iv) graft copolymers prepared by modifying the above-mentioned (i) to (iii) with a modifying agent of an unsaturated carboxylic acid or an anhydride thereof such as maleic anhydride, maleic acid, itaconic anhydride, itaconic acid, (meth)acrylic acid or the like, etc. One alone or two or more of these may be used here either singly or as combined.

The glass transition temperature (Tg) of the cyclic olefin-based resin (F) is preferably from 50 to 110° C., more preferably from 50 to 105° C., even more preferably from 55 to 90° C., still more preferably from 60 to 90° C., further more preferably from 65 to 85° C. When the glass transition temperature (Tg) falls within the range, it is favorable since the transparency of the laminate for solar cells of the present invention can be enhanced without significantly worsening the heat resistance and the workability thereof.

The cyclic olefin-based resin (F) is poorly miscible with the etylene-based polymer (C) that constitutes the resin layer (II), and therefore, when the transparency is taken into consideration, the mean refractive index at room temperature of the resin is preferably from 1.51 to 1.54, more preferably from 1.515 to 1.535, and the absolute value of the difference in the mean refractive index between the resin (F) and the etylene-based resin (C) is preferably at most 0.01, more preferably at most 0.005, even more preferably at most 0.003. When the absolute value of the mean refractive index difference falls within the range, it is favorable since the transparency can be enhanced without being so much influenced by the dispersion diameter of the cyclic olefin-based resin (F) in the resin layer (II). The mean refractive index can be measured according to a known method, for example, using an Abbe's refractometer.

Specific examples of the cyclic olefin-based resin (F) include Zeon's trade name "ZEONOR", Mitsui Chemical's trade name "APEL", AND Polyplastics' trade name "TOPAS". The cyclic olefin-based resin (F) can also be produced according to known methods described in, for example, JP-A 60-168708, 61-115916, 61-271308, 61-252407, etc.

(Resin Layer (II))

The resin layer (II) in the laminate for solar cells of the present invention is a resin layer containing the above-mentioned etylene-based polymer (C) and the above-mentioned nucleating agent (D).

The content of the etylene-based polymer (C) in the resin layer (II) is generally at least 30% by mass, preferably from 30 to 99.9% by mass, more preferably from 30 to 90% by mass, even more preferably from 40 to 85% by mass, still more preferably from 40 to 80% by mass. The content of the etylene-based resin (C) falling within the range is preferred as capable of imparting excellent rigidity, moisture-proofness and transparency.

Next, the content of the nucleating agent (D) in the resin layer (II) may be suitably defined within a range capable of bettering transparency and moisture-proofness, but is preferably from 0.01 to 3.0% by mass, more preferably from 0.03% by mass to 2.0% by mass, even more preferably from 0.05% by mass to 1.0% by mass. The content of the nucleating agent (D) falling within the range is preferred as capable of enhancing the rigidity, the transparency and the moisture-proofness of the laminate for solar cells of the present invention without significantly lowering the transparency owing to interfacial scattering to be caused by excessive addition of the agent.

Next, the content of the olefin-miscible resin (E) in the resin layer (II) is preferably from 0 to 40% by mass, more preferably from 5 to 30% by mass, even more preferably from 10 to 25% by mass. The olefin-miscible resin (E) falling within the range is preferred as capable of further enhancing the transparency and the moisture-proofness of the laminate for solar cells of the present invention without causing surface bleeding and without significantly worsening the mechanical properties of the laminate.

Next, the content of the cyclic olefin-based resin (F) in the resin layer (II) is preferably from 0 to 45% by mass, more preferably from 10 to 50% by mass, even more preferably from 15 to 40% by mass, still more preferably from 20 to 35% by mass, further more preferably from 25 to 30% by mass. The cyclic olefin-based resin (F) falling within the range is preferred as capable of further enhancing the transparency without significantly lowering the moisture-proofness.

In the present invention, the thickness of the resin layer (II) is not specifically defined. However, from the balance of moisture-proofness, transparency and rigidity, the thickness is preferably from 0.01 to 0.30 mm, more preferably from 0.03 to 0.25 mm, even more preferably from 0.03 to 0.20 mm, still more preferably from 0.05 to 0.15 mm.

[Other Resins]

In the resin layer (I) and the resin layer (II) constituting the laminate for solar cells of the present invention, any other resin may be incorporated within a range not overstepping the spirit and the scope of the present invention and for the purpose of further bettering various properties (flexibility, rigidity, heat resistance, transparency, adhesiveness, etc.) and enhancing the moldability and the workability and the economic potential of the laminate. In the resin layer (I), any other resins than the above-mentioned ethylene/α-olefin random copolymer (A) and the above-mentioned ethylene/α-olefin block copolymer (B) and also the above-mentioned silane-modified etylene-based resin (X) and polyetylene-based resin (Y) may be incorporated; and in the resin layer (II), any other resins than the above-mentioned etylene-based polymer (C), the above-mentioned olefin-miscible resin (E) and the above-mentioned cyclic olefin-based resin (F) may be incorporated. Here the other resins include, for example, other polyolefin-based resins and various elastomers (olefinic, styrenic and other elastomers), as well as resins modified with a polar group such as a carboxyl group, an amino group, an imide group, a hydroxyl group, an epoxy group, an oxazoline group, a thiol group, a silanol group or the like, etc.

[Additives]

If desired, various additives may be added to the resin layer (I) and/or the resin layer (II) constituting the laminate for solar cells of the present invention. The additives include, for example, silane coupling agent, antioxidant, UV absorbent, weather-resistant stabilizer, light diffusing agent, nucleating agent, pigment (e.g., white pigment), flame retardant, discoloration inhibitor, etc. In the present invention, at least one additive selected from silane coupling agent, antioxidant, UV absorbent and weather-resistant stabilizer is preferably added to the resin (I)-1 for the reasons mentioned below. At least one additive selected from antioxidant, UV absorbent and weather-resistant stabilizer is preferably added to the resin layer (I)-2 and/or resin layer (II) for the reasons mentioned below.

(Silane Coupling Agent)

The silane coupling agent is useful for enhancing the adhesiveness to protective materials (glass, resin-made front sheet, back sheet, etc.) for encapsulant materials, and to solar cell elements, etc., and includes, for example, compounds having a hydrolysable group such as an alkoxy group along with an unsaturated group such as a vinyl group, an acryloxy group or a methacryloxy group, or an amino group, an epoxy group or the like. Specific examples of the silane coupling agent include N-(β-aminoethyl)-γ-aminopropyltrimethoxysilane, N-(β-aminoethyl)-γ-aminopropylmethyldimethoxysilane, γ-aminopropyltriethoxysilane, γ-glycidoxypropyltrimethoxysilane, γ-methacryloxypropyltrimethoxysilane, etc. When added, preferably used is γ-glycidoxypropyltrimethoxysilane or γ-methacryloxypropyltrimethoxysilane as having good adhesiveness and is free from a problem of discoloration such as yellow discoloration. The amount of the silane coupling agent to be added is generally from 0.0 to 5.0 parts by mass or so relative to 100 parts by mass of the resin composition to constitute each resin layer, preferably from 0.1 to 5 parts by mass, more preferably from 0.2 to 3 parts by mass. Like the silane coupling agent, also effectively usable is a coupling agent such as an organic titanate compound or the like; however, in the present invention, it is desirable that the agent of the type is not added.

(Antioxidant)

Various commercial products are usable here as the antioxidant, including various types of antioxidants, such as monophenol-type, bisphenol-type, polymeric phenol-type, sulfur-containing and phosphite-type antioxidants, etc. The monophenol-type antioxidants include, for example, 2,6-di-tert-butyl-p-cresol, butylated hydroxyanisole, 2,6-di-tert-butyl-4-ethylphenol, etc. The bisphenol-type antioxidants include 2,2'-methylene-bis(4-methyl-6-tert-butylphenol), 2,2'-methylene-bis(4-ethyl-6-tert-butylphenol), 4,4'-thiobis (3-methyl-6-tert-butylphenol), 4,4'-butylidene-bis(3-methyl-6-tert-butylphenol), 3,9-bis[{1,1-dimethyl-2-{β-(3-tert-butyl-4-hydroxy-5-methy 1-phenyl) propionyloxy}ethyl}-2,4,9,10-tetroxaspiro]-5,5-undecane, etc.

The polymeric phenol-type antioxidants include 1,1,3-tris (2-methyl-4-hydroxy-5-tert-butylphenyl)butane, 1,3,5-trimethyl-2,4,6-tris(3,5-di-tert-butyl-4-hydroxybenzyl)benzene, tetrakis-{methylene-3-(3',5'-di-tert-butyl-4'-hydroxyphenyl) propionate}methane, bis{(3,3'-bis-4'-hydroxy-3'-tert-butylphenyl)butyric acid}glucose ester, 1,3,5-tris(3',5'-di-tert-butyl-4'-hydroxybenzyl)-s-triazin e-2,4,6-(1H,3H,5H)trione, triphenol(vitamin E), etc.

The sulfur-containing antioxidants include dilauroyl thiodipropionate, dimyristyl thiodipropionate, distearyl thiopropionate, etc.

The phosphite-type antioxidants include triphenyl phosphite, diphenylisodecyl phosphite, phenyldiisodecyl phosphite, 4,4'-butylidene-bis(3-methyl-6-tert-butylphenyl-di-tridecyl)phosphite, cyclic neopentane-tetrayl bis (octadecylphosphite), tris(mono and/or di)phenyl phosphite, diisodecyl pentaerythritol diphosphite, 9,10-dihydro-9-oxa-10-phosphaphenanthrene-10-oxide, 10-(3,5-di-tert-butyl-4-hydroxybenzyl)-9,10-dihydro-9-oxa-10-phosphaphenanthrene-10-oxide, 10-decyloxy-9,10-dihydro-9-oxa-10-phosphaphenanthrene, cyclic neopentane-tetrayl bis(2,4-di-tert-butylphenyl) phosphite, cyclic neopentane-tetrayl bis(2, 6-di-tert-methylphenyl)phosphite, 2,2-methylenebis(4,6-tert-butylphenyl)octyl phosphite, etc.

In the present invention, preferably used are phenol-type and phosphite-type antioxidants from the viewpoint of the effect, the thermal stability and the economic potential thereof, and more preferably the two different types of antioxidants are combined for use herein. The amount of the antioxidant to be added is generally from 0.1 to 1.0 part by mass or so relative to 100 parts by mass of the resin composition to constitute each resin layer, but preferably from 0.2 to 0.5 parts by mass.

(UV Absorbent)

Various commercial products are usable here as the UV absorbent, including various types of benzophenone-type, benzotriazole-type, triazine-type or salicylate-type UV absorbents and others. The benzophenone-type UV absorbents include, for example, 2-hydroxy-4-methoxybenzophenone, 2-hydroxy-4-methoxy-2'-carboxybenzophenone, 2-hydroxy-4-octoxybenzophenone, 2-hydroxy-4-n-dodecyloxybenzophenone, 2-hydroxy-4-n-octadecyloxybenzophenone, 2-hydroxy-4-benzyloxybenzophenone, 2-hydroxy-4-methoxy-5-sulfobenzophenone, 2-hydroxy-5-chlorobenzophenone, 2,4-dihydroxybenzophenone, 2,2'-dihydroxy-4-methoxybenzophenone, 2,2'-dihydroxy-4,4'-dimethoxybenzophenone, 2,2',4,4'-tetrahydroxybenzophenone, etc.

The benzotriazole-type UV absorbents include hydroxyphenyl-substituted benzotriazole compounds, for example, 2-(2-hydroxy-5-methylphenyl)benzotriazole, 2-(2-hydroxy-5-t-butylphenyl)benzotriazole, 2-(2-hydroxy-3,5-dimethylphenyl)benzotriazole, 2-(2-methyl-4-hydroxyphenyl)benzotriazole, 2-(2-hydroxy-3-methyl-5-t-butylphenyl) benzotriazole, 2-(2-hydroxy-3,5-di-t-amylphenyl) benzotriazole, 2-(2-hydroxy-3,5-di-t-butylphenyl) benzotriazole, etc. The triazine-type UV absorbents include 2-[4,6-bis(2,4-dimethylphenyl)-1,3,5-triazin-2-yl]-5-(octyloxy)phenol, 2-(4,6-diphenyl-1,3,5-triazin-2-yl)-5-(hexyloxy)phenol, etc. The salicylate-type UV absorbents include phenyl salicylate, p-octylphenyl salicylate, etc.

The amount of the UV absorbent to be added is generally from 0.01 to 2.0 parts by mass or so relative to 100 parts by mass of the resin composition to constitute each resin layer, but preferably from 0.05 to 0.5 parts by mass.

(Light Stabilizer)

As the weather-resistant stabilizer for imparting weather resistance apart from the above-mentioned LTV absorbent, preferred is use of hindered amine light stabilizers. The hindered amine light stabilizer does not absorb UV rays as compared with UV absorbents, but when combined with a UV-absorbent, it exhibits a noticeable synergistic effect. Some others than hindered amine compounds may function as a light stabilizer, but many of such compounds are colored and are therefore unfavorable for use in the laminate for solar cells of the present invention.

The hindered amine light stabilizer includes dimethyl succinate-1-(2-hydroxyethyl)-4-hydroxy-2,2,6,6-tetramethyl piperidine polycondensate, poly[{6-(1,1,3,3-tetramethylbutyl)amino-1,3,5-triazine-2,4-diyl}{(2,2,6,6-tetramethyl-4-piperidyl)imino}hexamethylene{{2,2,6,6-tetramethyl-4-piperidyl}imino}], N,N'-bis(3-aminopropyl) ethylenediamine-2,4-bis[N-butyl-N-(1,2,2,6,6-pentamethyl-4-piperidyl)amino]-6-chloro-1,3,5-triazine condensate, bis (2,2,6,6-tetramethyl-4-piperidyl) sebacate, bis(1,2,2,6,6-pentamethyl-4-piperidyl) 2-(3,5-di-tert-4-hydroxybenzyl)-2-n-butylmalonate, etc.

The amount of the hindered amine-type light stabilizer to be added is generally from 0.01 to 0.5 parts by mass or so relative to 100 parts by mass of the resin composition to constitute each resin layer, but is preferably from 0.05 to 0.3 parts by mass.

[Laminate for Solar Cells]

The laminate for solar cells of the present invention has the above-mentioned resin layer (II) on at least one side of the above-mentioned resin layer (I).

The laminate for solar cells of the present invention is excellent in moisture-proofness, and preferably, the water vapor permeability of the laminate having a total thickness of 0.3 mm at a temperature of 40° C. and a relative humidity of 90% is at most 3.0 g/(m²·24 hours). In the present invention, the water vapor permeability is preferably at most 2.0 g/(m²·24 hours), more preferably at most 1.0 g/(m²·24 hours), even more preferably at most 0.5 g/(m²·24 hours), from the viewpoint of the durability and the long-term reliability of solar cell modules produced by the use of the laminate for solar cells. Such excellent moisture-proofness in the present invention can be attained mainly by the combination of the etylene-based polymer (C) and the nucleating agent (D) and further by the addition of an olefin-miscible resin (E) and/or the cyclic olefin-based resin (F). The water vapor permeability can be determined according to various known methods; however, in the present invention, the water vapor permeability of the laminate sheet having a total thickness of 0.3 mm is measured under the condition at a temperature of 40° C. and a relative humidity of 90%, using MOCON's PERMATRAN W 3/31 according to JIS K7129B.

The flexibility and the rigidity of the laminate for solar cells of the present invention can be suitably controlled in consideration of the shape and the thickness of the solar cells to which the laminate is applied and of the site where the solar cells are installed. For example, in consideration of the handleability and the capability of preventing sheet surface blocking in collecting sheet-like laminates for solar cells of the present invention, and also in consideration of the weight reduction of solar cell modules (in general, thin-filmy glass (1.1 mm or so) is applicable to laminates having a thickness of 3 mm or so, or a glassless configuration is applicable thereto), it is desirable that the storage elastic modulus (E'), as measured through dynamic viscoelasticity measurement at a oscillation frequency of 10 Hz and at a temperature of 20° C., is preferably from 100 to 1000 MPa, more preferably from 150 to 900 MPa, even more preferably from 250 to 900 MPa, still more preferably from 300 to 700 MPa, further more preferably from 400 to 600 MPa. The storage elastic modulus (E') may be determined by the use of a viscoelasticity-measuring apparatus, with which the sample is analyzed at a oscillation frequency of 10 Hz within a predetermined temperature range and the value of the storage elastic modulus of the analyzed sample at a temperature of 20° C. is obtained.

The laminate for solar cells of the present invention has a multilayer configuration comprising the resin layer (I) as at least one outermost layer, and the resin layer (II), and therefore can satisfy the properties necessary for the surface layer such as adhesiveness and flexibility and the properties necessary for the entire laminate such as moisture-proofness and handleability (rigidity) in a well-balanced manner.

For example, the properties of flexibility and handleability (rigidity) are explained. The laminate for solar cells of the present invention comprises the resin layer (I) as a soft layer and the resin layer (II) as a hard layer, in which the thickness ratio of the two layers is suitably controlled, and therefore the laminate can satisfy both flexibility and handleability (rigidity) in a well-balanced manner. The laminate for solar cells of the present invention may have any laminate configuration of at least two layers of the resin layer (I) and the resin layer (II); however, from the viewpoint of curling prevention (flatness retention) and film formability for the laminate configuration, it is desirable that the laminate has a symmetric configuration of resin layer (I)/resin layer (II)/resin layer (I), or in other words, has a two-type three-layer configuration of soft layer/hard layer/soft layer.

The soft layer is not specifically defined; but preferably, the storage elastic modulus (E') thereof, as measured through dynamic viscoelasticity measurement at a oscillation frequency of 10 Hz and at a temperature of 20° C., is at most 100 MPa, more preferably from 5 to 50 MPa. The storage elastic modulus (E') of the hard layer is preferably more than 100 MPa, more preferably from 200 to 3000 MPa, even more preferably from 500 to 2000 MPa. The laminate configuration of the type is preferred as capable of relatively easily realizing satisfaction of both good protection (cushionability) for solar cell elements and good handleability (elastic modulus at room temperature) as the entire encapsulant material, in case where the laminate for solar cells of the present invention is used, for example, as a solar cell member.

The total light transmission of the laminate for solar cells of the present invention may not be that important depending on the type of the solar cells to which the laminate is applied, or for example, in case where the laminate is applied to amorphous thin-film silicon parts or the like at which the sunlight to reach the solar cell element is not so much blocked; however, in consideration of the photoelectric conversion efficiency of solar cells to which the laminate is applied or of the handleability of the laminate in further laminating various parts therewith, the total light transmission of the laminate having a total thickness of 0.3 mm is preferably at least 85%, more preferably at least 88%, even more preferably at least 90%. The total light transmittance can be determined according to various known methods; however, in the present invention, the total light transmission of the laminate sheet having a total thickness of 0.3 mm is measured with Murakami Color Research Laboratory's "Reflectance/Transmittance Meter" according to JIS K7105.

The laminate for solar cells of the present invention facilitates production of solar cell modules, and not requiring a crosslinking step, the laminate is favorably used as a solar cell member excellent in transparency, moisture-proofness, sealability, handleability (rigidity), etc. For satisfying all these properties, the laminate for solar cells of the present invention is preferably such that, when the laminate having a total thickness of 0.3 mm is analyzed for the properties thereof, the storage elastic modulus (E') of the laminate, as measured through dynamic viscoelasticity measurement at a oscillation frequency of 10 Hz and at a temperature of 20° C., is from 300 to 700 MPa, the water vapor transmittance thereof, as measured at a temperature of 40° C. and a relative humidity of 90%, is at most 3.0 g/(m²·24 hr), and the total light transmittance thereof is at least 85%. More preferably, the storage elastic modulus (E') of the laminate, as measured through dynamic viscoelasticity measurement at a oscillation frequency of 10 Hz and at a temperature of 20° C., is from 400 to 600 MPa, the water vapor transmittance thereof, as measured at a temperature of 40° C. and a relative humidity of 90%, is at most 2.0 g/(m²·24 hr), and the total light transmittance thereof is at least 87%; and even more preferably, the storage elastic modulus (E') of the laminate, as measured through dynamic viscoelasticity measurement at a oscillation frequency of 10 Hz and at a temperature of 20° C., is from 400 to 600 MPa, the water vapor transmittance thereof, as measured at a temperature of 40° C. and a relative humidity of 90%, is at most 1.0 g/(m²·24 hr), and the total light transmission thereof is at least 88%.

The heat resistance of the laminate for solar cells of the present invention is influenced by various properties (crystal melting peak temperature, heat of crystal fusion, MFR, molecule weight, etc.) of the resin for use in the resin layer (I) and the resin layer (II). In general, solar cell modules are heated up to from 85° C. to 90° C. or so by the heat generated during power generation or by the radiation heat of sunlight; however, so far as the crystal melting peak temperature is 100° C. or higher, the laminate for solar cells of the present invention can secure the necessary heat resistance and therefore the temperature range is favorable here.

The total thickness of the laminate for solar cells of the present invention is not specifically defined. In general, the laminate is used in the form of a sheet having a total thickness of from 0.03 to 1.0 mm or so, but from the viewpoint of transparency, moisture-proofness and handleability, the thickness is preferably from 0.10 to 0.75 mm, more preferably from 0.10 to 0.70 mm.

[Production Method for Laminate for Solar Cells]

Next described is a production method for the laminate for solar cells of the present invention.

As the production method for a sheet-like laminate for solar cells, herein employable is a known method, for example, an extrusion casting method, a calendering method, an inflation method or the like using a melt mixing apparatus such as a single-screw extruder, a multi-screw extruder, a Banbury mixer, a kneader or the like and using a T-die. Though not specifically defined, in the present invention, preferred is an extrusion casting method using a T-die from the viewpoint of the handleability and the productivity. The molding temperature in the extrusion casting method using a T-die may be suitably controlled depending on the flow properties and the film formability of the resin composition to constitute each resin layer, but may be generally from 130 to 300° C., preferably from 150 to 250° C. For lamination, also employable is any known method. For example, a coextrusion method, an extrusion lamination method, a thermal lamination method, a dry lamination method or the like is usable; however, in the present invention, preferred is a coextrusion method from the viewpoint of the handleability and the productivity. In the coextrusion method, various types of multilayer die may be selected. For example, there are mentioned a feed-block method and a multi-manifold method. For the purpose of preventing the reduction in the trimming efficiency for each resin layer and for preventing the reduction in transparency in regeneration and addition, a dumbbell-shaped die, a capsulationdie or the like may be suitably used here.

In the laminate for solar cells of the present invention, produced according to the above-mentioned production method, the ratio of the thickness of the resin layer (II) to the total thickness is preferably from 10% to 90%, more preferably from 20% to 70%, even more preferably from 20% to 60%, still more preferably from 30% to 60%, further more preferably from 35% to 55%. The thickness ratio of the resin layer (II) falling within the range is preferred, as capable of producing a laminate for solar cells excellent in balance of moisture-proofness, rigidity and transparency. In addition, the laminate for solar cells of the present invention is excellent in rigidity at room temperature. Therefore, when used in flexible solar cell modules, the laminate can impart rigidity (toughness) to the modules; and when used in rigid solar cell modules, the laminate is expected to attain weight reduction of the modules since thin-wall glass (for example, having a thickness of 1.1 mm) or a glassless configuration is applicable thereto.

Regarding the configuration of the laminate for solar cells of the present invention, the resin layer (I) is arranged as at least one outermost layer of the laminate, and for example, preferred is a two-type two-layer configuration of resin layer (I)/resin layer (II), or a two-type three-layer configuration of resin layer (I)/resin layer (II)/resin layer (I). However, for the purpose of further enhancing the properties of solar cell modules and for bettering the outward appearance thereof (by preventing warping or curling), any other laminate configuration is also employable here. For example, there are mentioned a three-type three-layer configuration of resin layer (I) (containing additive)/resin layer (I) (not containing additive)/resin layer (II), resin layer (I) (containing additive A)/resin layer (I) (containing additive B) (additives A and B differ in point of the additive formulation)/resin layer (II), resin layer (I)'/resin layer (I) "(resin layers (I)' and (I)" differ in point of the storage elastic modulus (E') and the blend ratio of additive)/resin layer (II), or resin layer (I)/resin layer (II)'/resin layer (II)" (resin layers (II)' and (II)" differ in point of the storage elastic modulus (E') and the blend ratio of additive); and a three-type five-layer configuration of resin layer (I)/adhesive layer/resin layer (II)/adhesive layer/resin layer (II) (adhesive layer is for adhering resin layer (I) and resin layer (II)), resin layer (I)/regenerated layer/resin layer (II)/regenerated layer/resin layer (I), or resin layer (I)/regenerated layer/resin layer (II)/regenerated layer/resin layer (II), etc. Here, the edges as trimmed away from the laminate for solar cells of the present invention and also the winding wastes to form during width control of the laminate may be added to the regenerated layer. In the present invention, it is desirable that the edges as trimmed away from the laminate for solar cells of the present invention and also the winding wastes to form during width control (by slitting) of the laminate are not added, if possible, to the resin layer (II) in order not to worsen the moisture-proofness, the transparency and the rigidity that are the main function of the resin layer (II), and those edges and winding wastes are added to the regenerated layer arranged in the laminate configuration.

Various additives such as an antioxidant, a UV absorbent, a weather-resistant stabilizer and the like, which can be used for the laminate for solar cells of the present invention may be previously dry-blended with resin and then fed into a hopper; or all the materials may be previously melt-mixed and pelletized, and then the pellets may be fed thereinto; or a master batch in which the additives alone are previously concentrated in resin may be prepared and fed into the production line. If desired, the surface and/or the back of the laminate for solar cells of the present invention, which has been produced in the form of a sheet, may be embossed or may be processed in any other mode to form projections thereon (in conical, pyramid-like, semi-spherical or any other form), for the purpose of preventing the surfaces of the sheet from blocking together in rolling up the sheet or for the purpose of enhancing the handleability and the degassing operation in a sealing process for solar cell elements.

Further, in producing the laminate for solar cells of the present invention, any other substrate film (for example, oriented polyester film (OPET), oriented polypropylene film (OPP), or various types of weather-resistant films such as ETFE (ethylene tetrafluoride/ethylene copolymer), PVF (polyvinyl fluoride), PVDF (polyvinylidene fluoride) or any other acrylic film, etc.) may be laminated on the laminate according to a method of extrusion lamination, coextrusion, sandwich lamination or the like. By laminating the laminate for solar cells of the present invention with any other various types of substrate films, the handleability of the resulting laminate may be enhanced, and the necessary properties and the economic potential of the laminate may be relatively readily controlled.

[Solar Cell Module]

The laminate for solar cells of the present invention is used as a member for solar cells, and the site where the laminate is used is not specifically defined. The laminate may be used mainly as a solar cell encapsulant laminate in a site for a solar cell encapsulant material to protect a solar cell element through adhesion thereto, or may also be used even in a site not adhering to a solar cell element for the purpose of controlling the flexibility, the rigidity, the curling resistance, the thickness and the dielectric breakdown voltage of the entire solar cell module. Here the specific examples of the site not adhering to a solar cell element include, for example as the constituent layer of the upper protective material of a solar cell module of upper protective material/encapsulant material/solar cell element/encapsulant material/lower protective material, a configuration of outermost surface layer/laminate for solar cells of the present invention/barrier layer, or outermost surface layer/barrier layer/laminate for solar cells of the present invention, or outermost surface layer/laminate for solar cells of the present invention, or outermost surface layer/laminate for solar cells of the present invention/barrier layer/laminate for solar cells of the present invention, etc. In addition, as the constituent layer of the lower protective material, there is mentioned a configuration of laminate for solar cells of the present invention/barrier layer/outermost back layer, or other polyolefin layer (CPP, etc.)/laminate for solar cells of the present invention/barrier layer/outermost back layer, other polyolefin layer (CPP, etc.)/barrier layer/laminate for solar cells of the present invention/outermost back layer, or other polyolefin layer (CPP, etc.)/laminate for solar cells of the present invention/outermost back layer, etc. In case where the laminate for solar cells of the present invention is used in a site not adhering to a solar cell element, the solar cell member to adhere to and protect the solar cell element in the case may be the laminate for solar cells of the present invention, or a commercial EVA or ionomer-type solar cell member. Here the solar cell module is described below, in which the laminate for solar cells of the present invention is used as the solar cell member to adhere to and protect the solar cell element.

Using the laminate for solar cells of the present invention, a solar cell module can be produced by fixing a solar cell element with upper and lower protective materials of a front sheet and back sheet. Various types of the solar cell module of the case are exemplified here. As one preferred example, there is mentioned a solar cell module produced by the use of the laminate for solar cells of the present invention as a encapsulant material therein, or that is, by using the solar cell encapsulant laminate and using an upper protective material, a solar cell element and a lower protective material. Concretely, there are mentioned a configuration of upper protective material/encapsulant material/solar cell element/encapsulant material/lower protective material, in which the solar cell element is sandwiched between the laminates for solar cells of the present invention on both sides thereof (see FIG. 1); a configuration in which a encapsulant material and an upper protective material are formed on the solar cell element formed on the inner peripheral surface of a lower protective material; a configuration where a encapsulant material and a lower protective material are formed on the solar cell element formed on the inner peripheral surface of an upper protective material, such as an amorphous solar cell element formed on a fluorine-containing resin-based transparent protective material by sputtering or the like thereon; etc. In the solar cell module using the laminate for solar cells of the present invention, in case where the encapsulant material is used in two or more sites, the laminate for solar cells of the present invention may be used in all the sites, or the laminate for solar cells of the present invention may be used only in one site. In such a case where the encapsulant material is used in two or more sites, the resin composition that constitutes the resin layer (I) and the resin layer (II) to constitute the laminate for solar cells of the present invention, and is used in each site as well as the thickness ratio of the resin layer (I) and the resin layer (II) in the laminate may be the same or different. In any case, preferably, the solar cell module is so designed that the resin layer (I) of the laminate for solar cells of the present invention could be kept in contact with the solar cell element therein, as securing sufficient adhesiveness and sealability in sealing the solar cell element.

The solar cell element to be arranged and connected by wiring between encapsulant materials includes, for example, single-crystal silicon-based, polycrystal silicon-based, amorphous silicon-based, gallium-arsenic, copper-indium-selenium, cadmium-tellurium or the like III-V group or II-VI group compound semiconductor-based, dye-sensitized type, organic thin film-type or the like solar cell elements.

The members to constitute the solar cell module produced by the use of the laminate for solar cells of the present invention are not specifically defined. As the upper protective material, for example, there are mentioned single-layer or multi-layer protective materials of plates or films of glass, acrylic resin, polycarbonate, polyester, fluorine-containing resin, etc. The lower protective material may be a single-layer or multi-layer sheet including various types of metal or thermoplastic resin films, and for example, there are mentioned a single-layer or multi-layer protective material of an inorganic material such as tin, aluminium, stainless or the like metal or glass, or a polyester, an inorganic substance-deposited polyester, a fluorine-containing resin, a polyolefin, etc. The surface of these upper and/or lower protective materials may be surface-treated in any known manner for primer treatment, corona treatment or the like for the purpose of enhancing the adhesiveness thereof to the laminate for solar cells of the present invention or to any other members.

One example of the solar cell module produced by the use of the laminate for solar cells of the invention as mentioned above, having a configuration of upper protective material/encapsulant material (resin layer (I)/resin layer (II)/resin layer (I))/solar cell element/encapsulant material (resin layer (I)/resin layer (II)/resin layer (I))/lower protective material where the solar cell element is sandwiched between the encapsulant materials on both sides thereof, is described below. As shown in FIG. 1, a transparent substrate 10, a encapsulant material 12A using the laminate for solar cells of the present invention (resin layer (I)/resin layer (II)/resin layer (I)), solar cell elements 14A and 14B, a encapsulant material 12B using the laminate for solar cells of the present invention (resin layer (I)/resin layer (II)/resin layer (I)), and a back sheet 16 are laminated in that order from the side of receiving sunlight, and to the lower surface of the back sheet 16, adhered is a junction box 18 (terminal box for connecting a wiring for taking out the generated electricity from the solar cell element). The solar cell elements 14A and 14B are connected by the wiring 20 for electrically leading the generated current to the outside. The wiring 20 is taken to the outside via the through-hole (not shown) formed in the back sheet 16, and is connected to the junction box 18.

As the production method for the solar cell module, employable is any known method with no specific limitation thereon. In general, the production method comprises a step of laminating an upper protective material, a encapsulant material, a solar cell element, a encapsulant material and a lower protective material in that order, and a step of laminating them under heat and pressure through vacuum suction. A batch-type production line, or a roll-to-roll type production line is applicable to the method.

The solar cell module produced by the use of the laminate for solar cells of the present invention is usable in various applications irrespective of indoor use or outdoor use, for example, for small-size solar cells such as typically those in mobile instruments, as well as large-size solar cells to be installed on roofs or rooftop decks, depending on the type of the solar cell and the module form to be applied thereto.

EXAMPLES

The present invention is described in more detail with reference to the following Examples, however, the present invention is not limited at all by these Examples. The sheets mentioned in the specification were analyzed for their data and evaluations, as mentioned below. In this, the sheet running direction from extruder is referred to as a machine direction, and the direction perpendicular to that direction is referred to as a transverse direction.

(1) Crystal Melting Peak Temperature (Tm)

Using Perkin Elmer's differential scanning calorimeter, trade name "Pyrisl DSC" and according to JIS K7121, about 10 mg of a sample was heated from −40° C. to 200° C. at a heating rate of 10° C./min, kept at 200° C. for 1 minute, and then cooled down to −40° C. at a cooling rate of 10° C./min, and again this was heated up to 200° C. at a heating rate of 10° C./min, and on the thermogram thus drawn through the cycle, the crystal melting peak temperature (Tm) (° C.) was acquired.

(2) Crystallization Peak Temperature (Tc)

Using Perkin Elmer's differential scanning calorimeter, trade name "Pyrisl DSC" and according to JIS K7121, about 10 mg of a sample was heated from −40° C. to 200° C. at a heating rate of 10° C./min, kept at 200° C. for 1 minute, and then cooled down to −40° C. at a cooling rate of 10° C./min, and on the thermogram thus drawn through the cycle, the crystallization peak temperature (° C.) was acquired.

(3) Heat of Crystal Fusion (ΔHm)

Using Perkin Elmer's differential scanning calorimeter, trade name "Pyrisl DSC" and according to JIS K7122, about 10 mg of a sample was heated from −40° C. to 200° C. at a heating rate of 10° C./min, kept at 200° C. for 1 minute, and then cooled down to −40° C. at a cooling rate of 10° C./min, and again this was heated up to 200° C. at a heating rate of 10° C./min, and on the thermogram thus drawn through the cycle, the heat of crystal fusion (ΔHm) (J/g) was acquired.

(4) Softening Temperature (Ts)

According to JIS K2207, the softening temperature of the olefin-miscible resin (E) was obtained.

(5) Molecular Weight Distribution Index (Mw/Mn)

Using Nihon Water's high-temperature GPC system, the weight-average molecular weight (Mw) and the number-average molecular weight (Mn) was measured, and the molecular weight distribution index (Mw/Mn) was computed.

(6) Transparency (Total Light Transmission)

The total light transmission of a sample having a thickness of 0.3 mm was measured with Murakami Color Research Laboratory's "Reflectance/Transmittance Meter" according to JIS K7105. The results are shown below, and in addition, the results of evaluation made according to the following standards are also shown.
(O) The total light transmission was at least 85%.
(x) The total light transmission was less than 85%.

(7) Moisture-proofness (water vapor permeability)

According to JIS K7129B and using MOCON's PERMATRANW3/31, the water vapor permeability of a sample having a thickness of 0.3 mm was measured in an atmosphere at 40° C. and 90% RH. The results are shown below, and in addition, the results of evaluation made according to the following standards are also shown.
(OO) The water vapor permeability was at most $1.0 \text{ g}/(\text{m}^2 \cdot 24 \text{ hr})$.
(O) The water vapor permeability was from more than $1.0 \text{ g}/(\text{m}^2 \cdot 24 \text{ hr})$ to $3.0 \text{ g}/(\text{m}^2 \cdot 24 \text{ hr})$.
(x) The water vapor permeability was more than $3.0 \text{ g}/(\text{m}^2 \cdot 24 \text{ hr})$.

(8) Rigidity (Storage Elastic Modulus (E'))

Examples 1 to 9, Comparative Examples 1 to 4, Reference Example 1

Using a viscoelasticity meter (IT Measurement's trade name: Viscoelasticity Spectrometer DVA-200), a sample was analyzed for the storage elastic modulus (E') thereof from −100° C. at a oscillation frequency of 10 Hz, at a heating rate of 3° C./min and at a strain of 0.1% and at a heating rate of 3° C./min, and from the obtained data, the storage elastic modulus (E') at 20° C. of the sample was read. Those of which the storage elastic modulus (E') at 20° C. of from 100 MPa to 1000 MPa were good (O), and the others were not good (x).

Examples 11 to 19, Comparative Examples 5 to 7

Using IT Measurement's viscoelasticity meter, trade name "Viscoelasticity Spectrometer DVA-200", a sample (4 mm in length, 60 mm in width) was analyzed in the lateral direction, at a oscillation frequency of 10 Hz, at a strain of 0.1%, at a heating rate of 3° C./min and at a chuck-to-chuck distance of 25 mm, in a range from −150° C. to 150° C., and from the found data, the storage elastic modulus (E') at 20° C. of the sample was obtained. The results are shown below, and in addition, the results of evaluation made according to the following standards are also shown.
(OO) The storage elastic modulus (E') at 20° C. was from 300 MPa to 700 MPa.
(O) The storage elastic modulus (E') at 20° C. was from 100 MPa to less than 300 MPa, or from more than 700 MPa to 1000 MPa.
(x) The storage elastic modulus (E') at 20° C. was more than 1000 MPa.

(9) Sealability

Using a vacuum laminator (NPC's trade name: LM30× 30), five layers of a white glass board having a thickness of 3 mm (Asahi Glass's trade name: Solite), a encapsulant material having a thickness of 0.3 mm, a solar cell element having a thickness of 0.4 mm (France Photowatt's trade name: 101×101 MM), a encapsulant material having a thickness of 0.3 mm, and a weather-resistant PET film having a thickness of 0.125 mm (Toray's trade name: Lumirror X10S) were, as laminated in that order from the hot plate side, pressed in vacuum at a hot plate temperature of 150° C. and for a processing time of 20 minutes (breakdown, vacuuming: 5 minutes, pressing: 5 minutes, pressure keeping: 10 minutes), under a rapid pressure-lamination speed condition, thereby producing a solar cell module (size: 150 mm×150 mm). The outward appearance of the solar cell module was visually inspected, and the results were evaluated according to the following standards.

(O) The encapsulant material fully spread around the solar cell element with no space therearound.

(x) The encapsulant material could not fully spread around the solar cell element, therefore producing air bubbles therearound and partly failing in adhesion.

(10) Heat Resistance

A sheet-like encapsulant material having a thickness of 0.3 mm was sandwiched between a white glass board having a thickness of 3 mm (size: 75 mm in length, 25 mm in width) and an aluminium plate having a thickness of 5 mm (size: 120 mm in length, 60 mm in width), and laminated under pressure using a vacuum pressing machine at 150° C. for 15 minutes to produce a laminate sample; the sample was installed in a constant-temperature constant-humidity tank at 85° C. and 85% RH, as inclined by 60 degrees therein; and after 2000 hours, the condition of the laminate sample was checked according to the following standards.

(O) Glass did not shift from the initial standard position.

(x) Glass shifted from the initial standard position or the sheet melted.

(11) Mean Refractive Index

Using Abbe's refractiometer produced by Atago and according to JIS K7142, the refractive index of a sample was measured with sodium D line (589 nm) as the light source.

(12) Vicat Softening Temperature

Measured according to JIS K7206. Briefly, while a total load of 10 N (method A) was given to a test piece put in a hot bath, via a needle-like indenter having a tip cross section of 1 mm$^2$ and set vertically to the test piece, the heat-transfer medium was heated at a rate of 50° C./hr, whereupon the temperature at the time at which the indenter tip had come in the test piece by 1 mm was measured, and this is the Vicat softening temperature of the test piece.

<Materials Used>

[Ethylene/α-Olefin Random Copolymer (A)]

(A)-1: ethylene/octene random copolymer (Dow Chemical's trade name: Engage 8200, ethylene/octene=76/24 mass % (93/7 mol %), crystal melting peak temperature=65° C., heat of crystal fusion =53 J/g)

(A)-2: ethylene/propylene/hexene random copolymer (Japan Polyethylene's trade name: Karnel KJ640T, ethylene/propylene/hexane=80/10/10 mass % (89/7/4 mol %), crystal melting peak temperature=53° C., heat of crystal fusion =58 J/g)

[Ethylene/α-Olefin Block Copolymer (B)]

(B)-1: ethylene/octene block copolymer (Dow Chemical's trade name: Infuse 9000, ethylene/octene=65/35 mass (88/12 mol %), crystal melting peak temperature=122° C., heat of crystal fusion=44 J/g)

[Etylene-Based Polymer (C)]

(C)-1: ethylene/butene/octene random copolymer (Asahi Kasei's trade name: CREOLEX K4125, ethylene/1-butene/1-octene=97.7/1.1/1.2 mass % (99.1/0.6/0.3 mol %), density=0.941 g/cm$^3$, crystal melting peak temperature=130° C., heat of crystal fusion=183 J/g, crystallization peak temperature (Tc(B))=114° C., Mw/Mn=3.12, storage elastic modulus (E') at 20° C.=1100 MPa, mean refractive index=1.5274, MFR (temperature 190° C., load 21.18 N)=2.5 g/10 min)

(C)-2: ethylene/butene/octene random copolymer (Asahi Kasei's trade name: CREOLEX K4750, ethylene/1-butene/1-octene=97.9/0.8/1.3 mass (99.3/0.4/0.3 mol %), density=0.947 g/cm$^3$, crystal melting peak temperature=131° C., heat of crystal fusion=181 J/g, crystallization peak temperature (Tc(B))=113° C., Mw/Mn=2.87, storage elastic modulus (E') at 20° C.=1478 MPa, mean refractive index=1.5300, MFR (temperature 190° C., load 21.18 N)=5 g/10 min)

(C)-3: ethylene homopolymer (Asahi Kasei's trade name: Suntec HD F371, ethylene. 100 mass % (100 mol %), density=0.944 g/cm$^3$, crystal melting peak temperature=131° C., heat of crystal fusion=167 J/g, crystallization peak temperature (Tc(B))=114° C., Mw/Mn=4.72, storage elastic modulus (E') at 20° C.=1218 MPa, MFR (temperature 190° C., load 21.18 N)=0.45 g/10 min)

(C)-4: ethylene/hexene random copolymer (Ube Maruzen Polyethylene's trade name: UMERIT 2040FC, density=0.918 g/cm$^3$, crystal melting peak temperature=121° C., heat of crystal fusion=134 J/g, crystallization peak temperature (Tc(B))=105° C., Mw/Mn=2.80, storage elastic modulus (E') at 20° C.=451 MPa, mean refractive index=1.5120, MFR (temperature 190° C., load 21.18 N)=5 g/10 min)

[Nucleating Agent (D)]

(D)-1: fatty acid metal salt (zinc stearate/calcium 1,2-cyclohexane-dicarboxylate=34/66 mass %)

[Olefin-Miscible Resin (E)]

(E)-1: hydrogenated petroleum resin (Arakawa Chemical Industry's trade name: Arkon P115, softening temperature Ts (E) =115° C.)

(E)-2: hydrogenated petroleum resin (Arakawa Chemical Industry's trade name: Arkon P140, softening temperature Ts (E) =140° C.)

[Cyclic Olefin-Based Resin (F)]

(F)-1: cyclic olefin-based resin (Polyplastics' trade name: TOPAS 9506F-04, glass transition temperature=68° C., amorphous (heat of crystal fusion=0 J/g), mean refractive index=1.5287)

[Additive (G)]

(G)-1: silane coupling agent (Shinetsu Chemical's trade name: KBM503, γ-methacryloxypropyltrimethoxysilane)

[Silane-Modified Etylene-based Resin (X)]

(X)-1: silane-modified ethylene/octene random copolymer (Mitsubishi Chemical's trade name: LINKLON SL800N, density=0.868 g/cm$^3$, crystal melting peak temperature=54° C. and 116° C., heat of crystal fusion=22 J/g and 4 J/g, storage elastic modulus (E') at 20° C.=15 MPa, mean refractive index=1.4857, MFR (temperature 190° C., load 21.18 N)=1.7 g/10 min)

(X)-2: silane-modified ethylene/hexene random copolymer (Mitsubishi Chemical's trade name: LINKLON XLE815N, density =0.915 g/cm$^3$, crystal melting peak temperature=121° C., heat of crystal fusion=127 J/g, storage elastic modulus (E') at 20° C.=398 MPa, mean refractive index=1.5056, MFR (temperature 190° C., load 21.18 N)=0.5 g/10 min)

[Polyetylene-based Resin (Y)]

(Y)-1: ethylene/octene random copolymer (Dow Chemical's trade name: Affinity EG8200G, density=0.870 g/cm$^3$, ethylene/1-octene=68/32 mass % (89/11 mol %), crystal melting peak temperature=59° C., heat of crystal fusion=49 J/g, Vicat softening temperature=45° C., storage elastic modulus (E') at 20° C.=14 MPa, mean refractive index=1.4856, MFR (temperature 190° C., load 21.18 N)=5 g/10 min)

(Y)-2: ethylene/octene block copolymer (Dow Chemical's trade name: Infuse 9000, density=0.875 g/cm$^3$, ethylene/1-octene =65/35 mass (88/12 mol %), crystal melting peak temperature =122° C., heat of crystal fusion=44 J/g, storage elastic modulus (E') at 20° C.=27 MPa, mean refractive index=1.4899, MFR (temperature 190° C., load 21.18 N)=0.5 g/10 min)

Example 1

(A)-1, (B)-1 and (G)-1 were dry-blended in a mixing ratio by mass of 94.5/5/0.5, and then using a unidirectional twin-screw extruder with φ40 mm and through the two-type three-layer multi-manifold die thereof, this was extruded as a resin layer (I) to be both outer layers, at a preset temperature of from 190 to 200° C. Simultaneously, (C)-1 and (D)-1 were dry-blended in a mixing ratio by mass of 99.9/0.1, and then using a unidirectional twin-screw extruder with φ40 mm and through the die thereof, this was extruded as a resin layer (II) to be an interlayer, at a preset temperature of from 200 to 220° C. In this case, the discharge rate of the molten resin was so controlled that the thickness of each layer could be resin layer (I)/resin layer (II)/resin layer (I)=0.1/0.1/0.1 (mm). Next, the coextruded sheet was rapidly cooled on a cast roll at about 20° C. to give a laminate sheet having a thickness of 0.3 mm. The obtained laminate sheet was evaluated in point of the transparency, the water vapor permeability and the heat resistance thereof. The results are shown in Table 1.

Example 2

According to the same method as in Example 1 except that the resin composition to constitute the resin layer (II) was changed to one prepared by mixing (C)-1, (D)-1 and (E)-1 in a mixing ratio by mass of 79.9/0.1/20, a laminate sheet having the same thickness configuration as in Example 1 was produced and evaluated. The results are shown in Table 1.

Example 3

According to the same method as in Example 1 except that the resin composition to constitute the resin layer (II) was changed to one prepared by mixing (C)-1, (D)-1, (E)-1 and (F)-1 in a mixing ratio by mass of 49.9/0.1/20/30, a laminate sheet having the same thickness configuration as in Example 1 was produced and evaluated. The results are shown in Table 1.

Example 4

According to the same method as in Example 1 except that (C)-1 in the resin composition to constitute the resin layer (II) in Example 3 was changed to (C)-2, a laminate sheet having the same thickness configuration as in Example 3 was produced and evaluated. The results are shown in Table 1.

Example 5

According to the same method as in Example 1 except that (C)-1 in the resin composition to constitute the resin layer (II) in Example 3 was changed to (C)-3, a laminate sheet having the same thickness configuration as in Example 3 was produced and evaluated. The results are shown in Table 1.

Example 6

According to the same method as in Example 1 except that (A)-1 in the resin composition to constitute the resin layer (I) in Example 3 was changed to (A)-2, a laminate sheet having the same thickness configuration as in Example 3 was produced and evaluated. The results are shown in Table 1.

Example 7

According to the same method as in Example 1 except that (C)-1 in the resin composition to constitute the resin layer (II) was changed to (C)-4, a laminate sheet having the same thickness configuration as in Example 1 was produced and evaluated. The results are shown in Table 1.

Example 8

According to the same method as in Example 3 except that (E)-1 in the resin composition to constitute the resin layer (II) was changed to (E)-2, a laminate sheet having the same thickness configuration as in Example 3 was produced and evaluated. The results are shown in Table 1.

Example 9

(A)-1, (B)-1 and (G)-1 were dry-blended in a mixing ratio by mass of 94.5/5/0.5, and then using a unidirectional twin-screw extruder with φ40 mm and through the two-type two-layer multi-manifold die thereof, this was extruded as a resin layer (I) at a preset temperature of from 190 to 200° C. Simultaneously, (C)-1, (D)-1, (E)-1 and (F)-1 were dry-blended in a mixing ratio by mass of 49.9/0.1/20/30, and then using a unidirectional twin-screw extruder with φ40 mm and through the die thereof, this was extruded as a resin layer (II) at a preset temperature of from 200 to 220° C. In this case, the discharge rate of the molten resin was so controlled that the thickness of each layer could be resin layer (I)/resin layer (II)=0.15/0.15 (mm). Next, the coextruded sheet was rapidly cooled on a cast roll at about 20° C. to give a laminate sheet having a thickness of 0.3 mm. The obtained laminate sheet was evaluated in the same manner as in Example 1. The results are shown in Table 1.

Comparative Example 1

According to the same method as in Example 1 except that (C)-1 alone was used as the resin composition to constitute the resin layer (II), a laminate sheet having the same thickness configuration as in Example 1 was produced and evaluated. The results are shown in Table 1.

Comparative Example 2

According to the same method as in Example 1 except that (C)-1 in the resin composition to constitute the resin layer (II) was changed to Prime Polymer's trade name, Hizex 3600F (high-density polyethylene, ethylene=100 mass % (100 mol %), density=0.958 g/cm$^3$, crystal melting peak temperature=134° C., heat of crystal fusion=195 J/g, crystallization peak temperature=116° C., Mw/Mn=4.72, hereinafter abbreviated as (N)-1), a laminate sheet having the same thickness configuration as in Example 1 was produced and evaluated. The results are shown in Table 1.

Comparative Example 3

According to the same method as in Example 1 except that the resin composition to constitute the resin layer (I) was changed to one prepared by mixing (A)-1 and (G)-1 in a mixing ratio by mass of 99.5/0.5, a laminate sheet having the same thickness configuration as in Example 1 was produced and evaluated. The results are shown in Table 1.

Comparative Example 4

In Example 1, a single-layer sheet having a thickness of 0.3 mm of the resin layer (II) alone and not having the resin layer (I) was produced. The obtained sheet was evaluated in the same manner as in Example 1, and the results are shown in Table 1.

Reference Example 1

In Example 1, a single-layer sheet having a thickness of 0.3 mm of the resin layer (I) alone and not having the resin layer (II) was produced. The obtained sheet was evaluated in the same manner as in Example 1, and the results are shown in Table 1.

TABLE 1

| | | Example 1 | Example 2 | Example 3 | Example 4 | Example 5 | Example 6 | Example 7 |
|---|---|---|---|---|---|---|---|---|
| Resin Layer (I) | (A)-1 | 94.5 | 94.5 | 94.5 | 94.5 | 94.5 | | 94.5 |
| | (A)-2 | | | | | | 94.5 | |
| | (B)-1 | 5 | 5 | 5 | 5 | 5 | 5 | 5 |
| | (G)-1 | 0.5 | 0.5 | 0.5 | 0.5 | 0.5 | 0.5 | 0.5 |
| Resin Layer (II) | (C)-1 | 99.9 | 79.9 | 49.9 | | | 49.9 | |
| | (C)-2 | | | | 49.9 | | | |
| | (C)-3 | | | | | 49.9 | | |
| | (C)-4 | | | | | | | 99.9 |
| | (D)-1 | 0.1 | 0.1 | 0.1 | 0.1 | 0.1 | 0.1 | 0.1 |
| | (E)-1 | | 20 | 20 | 20 | 20 | 20 | |
| | (E)-2 | | | | | | | |
| | (F)-1 | | | 30 | 30 | 30 | 30 | |
| | (N)-1 | | | | | | | |
| Layer Configuration | | (I)/(II)/(I) | (I)/(II)/(I) | (I)/(II)/(I) | (I)/(II)/(I) | (I)/(II)/(I) | (I)/(II)/(I) | (I)/(II)/(I) |
| Total Thickness (mm) | | 0.3 | 0.3 | 0.3 | 0.3 | 0.3 | 0.3 | 0.3 |
| Thickness Ratio of Resin Layer (II) (%) | | 33 | 33 | 33 | 33 | 33 | 33 | 33 |
| Total light transmission (%) | | 87 (○) | 88 (○) | 90 (○) | 90 (○) | 89 (○) | 90 (○) | 90 (○) |
| Water Vapor Permeability (g/m² · 24 hr) | | 0.9 (○○) | 0.7 (○○) | 0.5 (○○) | 0.3 (○○) | 0.5 (○○) | 0.5 (○○) | 2.2 (○) |
| Storage Elastic Modulus (E') (MPa) | | 468 (○) | 506 (○) | 648 (○) | 685 (○) | 654 (○) | 654 (○) | 186 (○) |
| Sealability | | ○ | ○ | ○ | ○ | ○ | ○ | ○ |
| Heat Resistance | | ○ | ○ | ○ | ○ | ○ | ○ | ○ |

| | | Example 8 | Example 9 | Comparative Example 1 | Comparative Example 2 | Comparative Example 3 | Comparative Example 4 | Reference Example 1 |
|---|---|---|---|---|---|---|---|---|
| Resin Layer (I) | (A)-1 | 94.5 | 94.5 | 94.5 | 94.5 | 99.5 | | 94.5 |
| | (A)-2 | | | | | | | |
| | (B)-1 | 5 | 5 | 5 | 5 | | | 5 |
| | (G)-1 | 0.5 | 0.5 | 0.5 | 0.5 | 0.5 | | 0.5 |
| Resin Layer (II) | (C)-1 | 49.9 | 49.9 | 100 | | 99.9 | 99.9 | |
| | (C)-2 | | | | | | | |
| | (C)-3 | | | | | | | |
| | (C)-4 | | | | | | | |
| | (D)-1 | 0.1 | 0.1 | | 0.1 | 0.1 | 0.1 | |
| | (E)-1 | | 20 | | | | | |
| | (E)-2 | 20 | | | | | | |
| | (F)-1 | 30 | 30 | | | | | |
| | (N)-1 | | | | 99.9 | | | |
| Layer Configuration | | (I)/(II)/(I) | (I)/(II) | (I)/(II)/(I) | (I)/(II)/(I) | (I)/(II)/(I) | (II) | (I) |
| Total Thickness (mm) | | 0.3 | 0.3 | 0.3 | 0.3 | 0.3 | 0.3 | 0.3 |
| Thickness Ratio of Resin Layer (II) (%) | | 33 | 50 | 33 | 33 | 33 | 100 | 0 |
| Total light transmission (%) | | 90 (○) | 90 (○) | 81 (x) | 82 (x) | 87 (○) | 83 (x) | 91 (○) |
| Water Vapor Permeability (g/m² · 24 hr) | | 1.9 (○) | 0.3 (○○) | 1.3 (○) | 0.9 (○○) | 0.8 (○○) | 0.6 (○○) | 4.2 (x) |

TABLE 1-continued

| Storage Elastic Modulus (E') (MPa) | 662 (○) | 986 (○) | 382 (○) | 564 (○) | 467 (○) | 1400 (x) | 12 (x) |
|---|---|---|---|---|---|---|---|
| Sealability | ○ | ○ | ○ | ○ | ○ | x | ○ |
| Heat Resistance | ○ | ○ | ○ | ○ | x | ○ | ○ |

As obvious from Table 1, the laminates for solar cells of the present invention demonstrated in Examples 1 to 9 were all excellent in all of moisture-proofness, transparency, sealability, handleability and heat resistance. On the other hand, the sheets of Comparative Examples 1 to 4, which differ from those of the present invention in point of the composition and the configuration, were poor in at least one of moisture-proofness, transparency, sealability, handleability and heat resistance.

Example 10

Using NPC's vacuum laminator LM30×30, five layers of a white glass board having a thickness of 3 mm (Asahi Glass's trade name: Solite) as the upper protective material, the laminate sheet having a thickness of 0.3 mm produced in Example 3 (encapsulant material and the resin layer (I) were on the side of the solar cell element), a solar cell element (simply referred to as cell) having a thickness of 0.4 mm (Photowatt's Model 101×101 MM), the laminate sheet having a thickness of 0.3 mm produced in Example 3 (encapsulant material and the resin layer (I) were on the side of the solar cell element), and a weather-resistant PET film having a thickness of 0.125 mm (Toray's Lumirror X10S) as the lower protective material were, as laminated in that order from the hot plate side, pressed in vacuum at a hot plate temperature of 150° C. and for a processing time of 20 minutes (breakdown, vacuuming: 5 minutes, pressing: 5 minutes, pressure keeping: 10 minutes), under a rapid pressure-lamination speed condition, thereby producing a solar cell module (size: 150 mm×150 mm). The obtained solar cell module was excellent in transparency and appearance.

Example 11

Using a unidirectional twin-screw extruder with ϕ40 mm and through the two-type three-layer multi-manifold die thereof, (X)-1 and (Y)-1 were, in a mixing ratio by mass of 30/70, extruded as a resin layer (I) to be both outer layers, at a preset temperature of from 180 to 200° C. Also using a unidirectional twin-screw extruder with ϕ440 mm and through the die thereof, (C)-1 and (D)-1 were, in a mixing ratio by mass of 99.9/0.1, extruded as a resin layer (II) to be an interlayer, at a preset temperature of from 200 to 230° C. Next, the discharge amount of the molten resin was controlled and the coextruded sheet was rapidly cooled on a cast roll at about 20° C., thereby producing a laminate sheet having a total thickness of 0.3 mm, in which the thickness of each layer was resin layer (I)/resin layer (II)/resin layer (I)=0.1/0.1/0.1 (mm). The obtained laminate sheet was evaluated in point of the transparency, the moisture-proofness and the heat resistance thereof. The results are shown in Table 2.

Example 12

According to the same method as in Example 11 except that (C)-1 in the resin composition to constitute the resin layer (II) was changed to (C)-4, a laminate sheet having the same thickness configuration as in Example 11 was produced. The obtained laminate sheet was evaluated in point of the transparency, the moisture-proofness and the heat resistance thereof. The results are shown in Table 2.

Example 13

According to the same method as in Example 12 except that the resin composition to constitute the resin layer (I) was changed to one prepared by mixing (X)-2 and (Y)-1 in a mixing ratio by mass of 5/95, a laminate sheet having the same thickness configuration as in Example 12 was produced. The obtained laminate sheet was evaluated in point of the transparency, the moisture-proofness and the heat resistance thereof. The results are shown in Table 2.

Example 14

According to the same method as in Example 12 except that the resin composition to constitute the resin layer (I) was changed to one prepared by mixing (X)-1, (Y)-1 and (Y)-2 in a mixing ratio by mass of 10/85/5, a laminate sheet having the same thickness configuration as in Example 12 was produced. The obtained laminate sheet was evaluated in point of the transparency, the moisture-proofness and the heat resistance thereof. The results are shown in Table 2.

Example 15

According to the same method as in Example 11 except that the resin composition to constitute the resin layer (II) was changed to one prepared by mixing (C)-1, (D)-1 and (E)-1 in a mixing ratio by mass of 79.9/0.1/20, a laminate sheet having the same thickness configuration as in Example 11 was produced. The obtained laminate sheet was evaluated in point of the transparency, the moisture-proofness and the heat resistance thereof. The results are shown in Table 2.

Example 16

According to the same method as in Example 11 except that (E)-1 in the resin composition to constitute the resin layer (II) was changed to (E)-2, a laminate sheet having the same thickness configuration as in Example 15 was produced. The obtained laminate sheet was evaluated in point of the transparency, the moisture-proofness and the heat resistance thereof. The results are shown in Table 2.

Example 17

According to the same method as in Example 11 except that the resin composition to constitute the resin layer (II) was changed to (C)-1, (D)-1, (E)-1 and (F)-1 in a mixing ratio by mass of 49.9/0.1/20/30, a laminate sheet having the same thickness configuration as in Example 11 was produced. The obtained laminate sheet was evaluated in point of the transparency, the moisture-proofness and the heat resistance thereof. The results are shown in Table 2.

Example 18

According to the same method as in Example 17 except that (C)-1 in the resin composition to constitute the resin layer (II) was changed to (C)-2, a laminate sheet having the same thickness configuration as in Example 17 was produced. The obtained laminate sheet was evaluated in point of the transparency, the moisture-proofness and the heat resistance thereof. The results are shown in Table 2.

Example 19

According to the same method as in Example 17 except that (C)-1 in the resin composition to constitute the resin layer (II) was changed to (C)-3, a laminate sheet having the same thickness configuration as in Example 17 was produced. The obtained laminate sheet was evaluated in point of the transparency, the moisture-proofness and the heat resistance thereof. The results are shown in Table 2.

Comparative Example 5

According to the same method as in Example 11 except that (C)-1 was used alone as the resin composition to constitute the resin layer (II), a laminate sheet having the same thickness configuration as in Example 11 was produced. The obtained laminate sheet was evaluated in point of the transparency, the moisture-proofness and the heat resistance thereof. The results are shown in Table 2.

Comparative Example 6

According to the same method as in Example 11 except that (C)-1 in the resin composition to constitute the resin layer (II) was changed to Prime Polymer's trade name, Hizex 3600F (high-density polyethylene, ethylene=100 mass % (100 mol%), density=0.958 g/cm$^3$, crystal melting peak temperature=134° C., heat of crystal fusion=195 J/g, crystallization peak temperature=116° C., Mw/Mn=4.72, storage elastic modulus (E') at 20° C.=1581 MPa, MFR (temperature 190° C., load 21.18 N)=1 g/10 min, hereinafter abbreviated as (P)-1), a laminate sheet having the same thickness configuration as in Example 11 was produced. The obtained laminate sheet was evaluated in point of the transparency, the moisture-proofness and the heat resistance thereof. The results are shown in Table 2.

Comparative Example 7

In Example 11, the resin composition to constitute the resin layer (I) was made to be the same as the resin composition to constitute the resin layer (II), and a single-layer sheet having a total thickness of 0.3 mm and substantially formed of the resin layer (II) alone was produced. The obtained laminate sheet was evaluated in point of the transparency, the moisture-proofness and the heat resistance thereof. The results are shown in Table 2.

TABLE 2

|  |  |  | Example 11 | Example 12 | Example 13 | Example 14 | Example 15 | Example 16 |
|---|---|---|---|---|---|---|---|---|
| Resin Layer (I) (part by mass) | (X) | (X)-1 | 30 | 30 |  | 10 | 30 | 30 |
|  |  | (X)-2 |  |  | 5 |  |  |  |
|  | (Y) | (Y)-1 | 70 | 70 | 95 | 85 | 70 | 70 |
|  |  | (Y)-2 |  |  |  | 5 |  |  |
| Resin Layer (II) (part by mass) | (C) | (C)-1 | 99.9 |  |  |  | 79.9 | 79.9 |
|  |  | (C)-4 |  | 99.9 | 99.9 | 99.9 |  |  |
|  |  | (C)-2 |  |  |  |  |  |  |
|  |  | (C)-3 |  |  |  |  |  |  |
|  | (D) | (D)-1 | 0.1 | 0.1 | 0.1 | 0.1 | 0.1 | 0.1 |
|  | (E) | (E)-1 |  |  |  |  | 20 |  |
|  |  | (E)-2 |  |  |  |  |  | 20 |
|  | (F) | (F)-1 |  |  |  |  |  |  |
|  | — | (P)-1 |  |  |  |  |  |  |
| Layer Configuration |  |  | (I)/(II)/(I) | (I)/(II)/(I) | (I)/(II)/(I) | (I)/(II)/(I) | (I)/(II)/(I) | (I)/(II)/(I) |
| Total Thickness (mm) |  |  | 0.3 | 0.3 | 0.3 | 0.3 | 0.3 | 0.3 |
| Thickness Ratio of Resin Layer (II) (%) |  |  | 33 | 33 | 33 | 33 | 33 | 33 |
| Total light transmission (%) |  |  | 87 (∘) | 90 (∘) | 88 (∘) | 90 (∘) | 89 (∘) | 89 (∘) |
| Water Vapor Permeability (g/m$^2$ · 24 hr) |  |  | 0.9 (∘∘) | 2.2 (∘) | 2.1 (∘) | 2.2 (∘) | 0.7 (∘∘) | 1.7 (∘) |
| Storage Elastic Modulus (E') (MPa) |  |  | 453 (∘∘) | 190 (∘) | 196 (∘) | 191 (∘) | 503 (∘∘) | 537 (∘∘) |
| Scalability |  |  | ∘ | ∘ | ∘ | ∘ | ∘ | ∘ |
| Heat Resistance |  |  | ∘ | ∘ | ∘ | ∘ | ∘ | ∘ |

|  |  |  | Example 17 | Example 18 | Example 19 | Comparative Example 5 | Comparative Example 6 | Comparative Example 7 |
|---|---|---|---|---|---|---|---|---|
| Resin Layer (I) (part by mass) | (X) | (X)-1 | 30 | 30 | 30 | 30 | 30 |  |
|  |  | (X)-2 |  |  |  |  |  |  |
|  | (Y) | (Y)-1 | 70 | 70 | 70 | 70 | 70 |  |
|  |  | (Y)-2 |  |  |  |  |  |  |
| Resin Layer (II) | (C) | (C)-1 | 49.9 |  |  | 100 |  | 99.9 |
|  |  | (C)-4 |  |  |  |  |  |  |
|  |  | (C)-2 |  | 49.9 |  |  |  |  |

TABLE 2-continued

| (part by mass) | | (C)-3 | | | 49.9 | | |
|---|---|---|---|---|---|---|---|
| | (D) | (D)-1 | 0.1 | 0.1 | 0.1 | | 0.1 | 0.1 |
| | (E) | (E)-1 | 20 | 20 | 20 | | | |
| | | (E)-2 | | | | | | |
| | (F) | (F)-1 | 30 | 30 | 30 | | | |
| | — | (P)-1 | | | | | 99.9 | |
| Layer Configuration | | | (I)/(II)/ (I) | (I)/(II)/ (I) | (I)/(II)/ (I) | (I)/(II)/ (I) | (I)/(II)/ (I) | (II) |
| Total Thickness (mm) | | | 0.3 | 0.3 | 0.3 | 0.3 | 0.3 | 0.3 |
| Thickness Ratio of Resin Layer (II) (%) | | | 33 | 33 | 33 | 33 | 33 | 100 |
| Total light transmission (%) | | | 90 (○) | 90 (○) | 89 (○) | 82 (x) | 83 (x) | 83 (x) |
| Water Vapor Permeability (g/m² · 24 hr) | | | 0.6 (∞) | 0.5 (∞) | 0.5 (∞) | 1.3 (○) | 0.9 (∞) | 0.6 (∞) |
| Storage Elastic Modulus (E') (MPa) | | | 600 (∞) | 624 (∞) | 498 (∞) | 371 (∞) | 569 (∞) | 1400 (x) |
| Scalability | | | ○ | ○ | ○ | ○ | ○ | x |
| Heat Resistance | | | ○ | ○ | ○ | ○ | ○ | ○ |

Table 2 confirms that the laminates for solar cells of the present invention satisfy the evaluation standards of all the tested items of transparency, moisture-proofness and heat resistance (Examples 11 to 19). In the case where the olefin-miscible resin (E) was further added to the indispensable ingredients of the etylene-based rein (C) and the nucleating agent (D) in the resin layer (II), further improvement of the transparency and the moisture-proofness was confirmed (Example 15). In the case where the olefin-miscible resin (E) and the cyclic olefin-based resin (F) were further added to the indispensable ingredients of the etylene-based resin (C) and the nucleating agent (D) in the resin layer (II), it was confirmed that the obtained laminate was excellent in all the tested items in a high level (Examples 17 to 19).

On the other hand, in the case where the nucleating agent (D) was not contained (Comparative Example 5), and in the case where the heat of crystal fusion of the etylene-based polymer (C) used in the resin layer (II) was over the range defined in the present invention (Comparative Example 6), the laminates were poor in transparency; and in the case not having the resin layer (I) as at least one outermost layer, the laminate was poor in sealability and transparency (Comparative Example 7).

Example 20

Using NPC's vacuum laminator, trade name: LM30×30, five layers of a white glass board having a thickness of 3 mm (Asahi Glass's trade name: Solite) as the upper protective material, the laminate sheet having a total thickness of 0.3 mm produced in each Example (encapsulant material), a solar cell element (simply referred to as cell) having a thickness of 0.4 mm (Photowatt's trade name, 101×101 MM), the laminate sheet having a total thickness of 0.3 mm produced in each Example (encapsulant material), and a weather-resistant PET film having a thickness of 0.125 mm (Toray's trade name: Lumirror X10S) as the lower protective material were, as laminated in that order from the hot plate side, pressed in vacuum at a hot plate temperature of 150° C. and for a processing time of 20 minutes (breakdown, vacuuming: 5 minutes, pressing: 5 minutes, pressure keeping: 10 minutes), under a rapid pressure-lamination speed condition, thereby producing a solar cell module (size: 150 mm×150 mm). The obtained solar cell module was excellent in transparency and appearance.

DESCRIPTION OF REFERENCE NUMERALS AND SIGNS

10 Transparent Substrate
12A, 12B Encapsulant Resin Layer
14A, 14B Solar Cell Element
16 Back Sheet
18 Junction Box
20 Wiring

The invention claimed is:

1. A laminate, comprising:
an outermost resin layer, and
a second resin layer that comprises 30%-99.9% by mass of an ethylene-based polymer and 0.01%-3.0% by mass of a nucleating agent, each based on the mass of the second resin layer,
wherein the outermost resin layer comprises:
an ethylene/α-olefin random copolymer having a heat of crystal fusion of from 0 to 70 J/g as measured at a heating rate of 10° C./min in differential scanning calorimetry and an ethylene/α-olefin block copolymer having a crystal melting peak temperature of from 100 to 145° C. as measured at a heating rate of 10° C./min in differential scanning calorimetry and a heat of crystal fusion of from 5 to 70 J/g,
wherein a crystal melting peak temperature of the ethylene-based polymer of the second resin layer, as measured at a heating rate of 10° C./min in differential scanning calorimetry, is from 100 to 145° C., and a heat of crystal fusion of the ethylene-based polymer of the second resin layer is from 120 to 190 J/g, and
wherein a ratio of thickness of the second resin layer to a total thickness of the laminate is 0.2 to 0.6.

2. The laminate according to claim 1, wherein a content of the nucleating agent in the second resin layer is from 0.05% by mass to 1% by mass.

3. The laminate according to claim 1, wherein the second resin layer further comprises an olefin-miscible resin selected from the group consisting of a petroleum resin, a terpene resin, a coumarone-indene resin, a rosin resin, and any hydrogenated derivative thereof.

4. The laminate according to claim 3, wherein a softening temperature of the olefin-miscible resin is from 80° C. to [Tc(C)+5° C.], in which Tc(C) is a crystallization peak temperature of the ethylene-based polymer of the second resin layer measured at a cooling rate of 10° C./min in differential scanning calorimetry.

5. The laminate according to claim 1, wherein the ethylene-based resin of the second resin layer comprises from 0.1 to 3.0% by mass of at least one α-olefin selected from the group consisting of butene-1, hexene-1, and octene-1.

6. The laminate according to claim 1, wherein the second resin layer further comprises a cyclic olefin-based resin.

7. The laminate according to claim 1, wherein a storage elastic modulus of the outermost resin layer is smaller than a storage elastic modulus of the second resin layer, measured through dynamic viscoelasticity measurement at a oscillation frequency of 10 Hz and at a temperature of 20° C.

8. The laminate according to claim 7, wherein the storage elastic modulus of the outermost resin layer is at most 100 MPa, and the storage elastic modulus of the second resin layer is more than 100 MPa.

9. The laminate according to claim 1, wherein a water vapor permeability of the laminate having a total thickness of 0.3 mm, as measured at a temperature of 40° C. and at a relative humidity of 90%, is at most 3.0 g/(m$^2$·24 hours).

10. The laminate according to claim 1, wherein a storage elastic modulus of the laminate, as measured through dynamic viscoelasticity measurement at a oscillation frequency of 10 Hz and at a temperature of 20° C., is from 100 to 1000 MPa.

11. The laminate according to claim 1,
wherein a storage elastic modulus of the laminate having a total thickness of 0.3 mm, as measured through dynamic viscoelasticity measurement at a oscillation frequency of 10 Hz and at a temperature of 20° C., is from 300 to 700 MPa,
a water vapor permeability of the laminate having a total thickness of 0.3 mm, as measured at a temperature of 40° C. and at a relative humidity of 90%, is at most 3.0 g/(m$^2$·24 hours), and
a total light transmission of the laminate having a total thickness of 0.3 mm is at least 85%.

12. The laminate according to claim 1, wherein a total light transmission of the laminate having a thickness of 0.3 mm is at least 85%, as measured according to JIS K7105.

13. The laminate according to claim 1, wherein the outermost resin layer, the second resin layer, or both further comprises at least one additive selected from the group consisting of a silane coupling agent, an antioxidant, a UV absorbent, and a weather-resistant stabilizer.

14. The laminate according to claim 1, further comprising a third resin layer,
wherein either the third resin layer comprises an ethylene/α-olefin random copolymer having a heat of crystal fusion of from 0 to 70 J/g as measured at a heating rate of 10° C./min in differential scanning calorimetry and an ethylene/α-olefin block copolymer having a crystal melting peak temperature of from 100 to 145° C. as measured at a heating rate of 10° C./min in differential scanning calorimetry and a heat of crystal fusion of from 5 to 70 J/g, or the third resin layer comprises a silane-modified ethylene-based resin.

15. The laminate according to claim 1, suitable for adhering to and protecting a solar cell element.

16. A solar cell module, comprising:
the laminate of claim 1.

17. The laminate according to claim 1, wherein a ratio of the thickness of the second resin layer to a total thickness of the laminate is 0.35 to 0.55.

18. A laminate, comprising:
an outermost resin layer, and
a second resin layer that comprises 30%-99.9% by mass of an ethylene-based polymer and 0.01%-3.0% by mass of a nucleating agent, each based on the mass of the second resin layer,
wherein the outermost resin layer comprises:
a silane-modified ethylene-based resin and a polyethylene-based resin as the main ingredient thereof,
wherein a crystal melting peak temperature of the ethylene-based polymer of the second resin layer, as measured at a heating rate of 10° C./min in differential scanning calorimetry, is from 100 to 145° C., and a heat of crystal fusion of the ethylene-based polymer of the second resin layer is from 120 to 190 J/g, and
wherein a ratio of the thickness of the second resin layer to a total thickness of the laminate is 0.2 to 0.6.

19. The laminate according to claim 18, wherein a content of the nucleating agent in the second resin layer is from 0.05% by mass to 1.0% by mass.

20. The laminate according to claim 18, wherein the second resin layer further comprises an olefin-miscible resin selected from the group consisting of a petroleum resin, a terpene resin, a coumarone-indene resin, a rosin resin, and any hydrogenated derivative thereof.

* * * * *